United States Patent [19]
Yamamoto

[11] Patent Number: 5,084,894
[45] Date of Patent: Jan. 28, 1992

[54] OPTICAL SEMICONDUCTOR DEVICE

[75] Inventor: Eiji Yamamoto, Oume, Japan

[73] Assignee: Optical Measurement Technology Development Co., Ltd., Tokyo, Japan

[21] Appl. No.: 540,593

[22] Filed: Jun. 20, 1990

[30] Foreign Application Priority Data

| Jun. 20, 1989 | [JP] | Japan | 1-158635 |
| May 1, 1990 | [JP] | Japan | 2-116159 |
| May 29, 1990 | [JP] | Japan | 2-138855 |
| May 29, 1990 | [JP] | Japan | 2-138856 |
| May 29, 1990 | [JP] | Japan | 2-138857 |

[51] Int. Cl.$^5$ .................................................. H01S 3/19
[52] U.S. Cl. .................................. 372/50; 372/26; 372/46; 372/96
[58] Field of Search .......................... 372/26, 45, 46, 50, 372/96

[56] References Cited

U.S. PATENT DOCUMENTS 4,817,105 3/1989 Yano .................................... 372/26

Primary Examiner—James W. Davie
Attorney, Agent, or Firm—Cushman, Darby & Cushman

[57] ABSTRACT

An optical semiconductor device which can independently control optical gains or optical characteristics electrically by forming two layers on two pn junctions with either a pnp structure or an npn structure of a band gap energy narrower than adjacent layers thereto to enable increase of modulation width of a monolithic integrated laser with an optical modulator such as wavlength tunable laser or control of spectrum forms of a semiconductor optical amplifier.

25 Claims, 30 Drawing Sheets

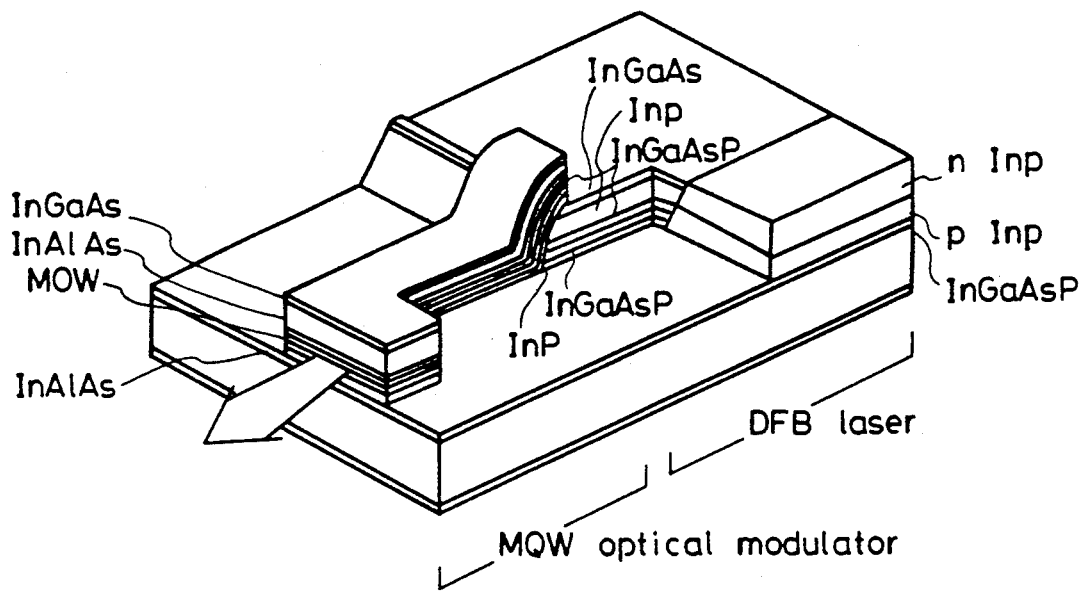
prior art
FIG. 6
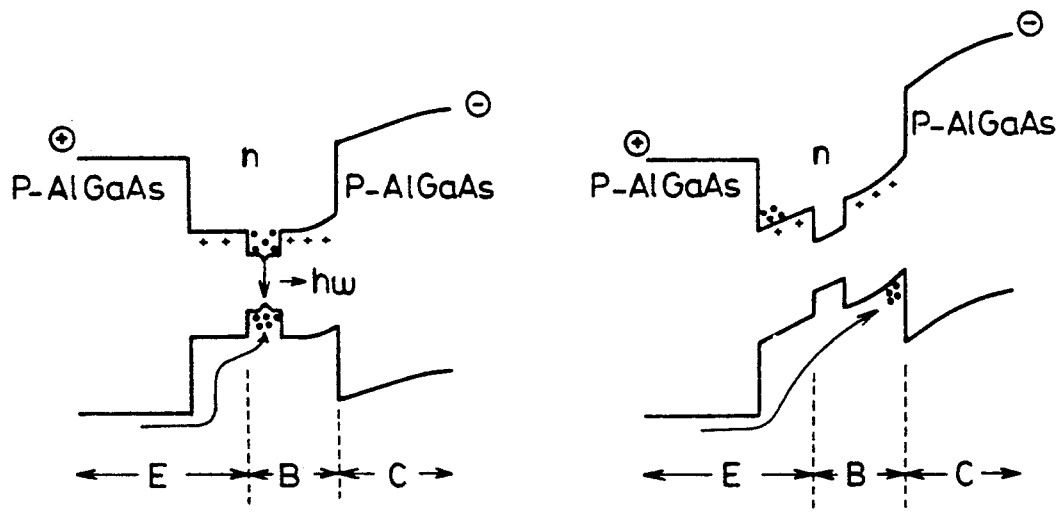
field off (prior art)
FIG. 7a
field on (prior art)
FIG. 7b

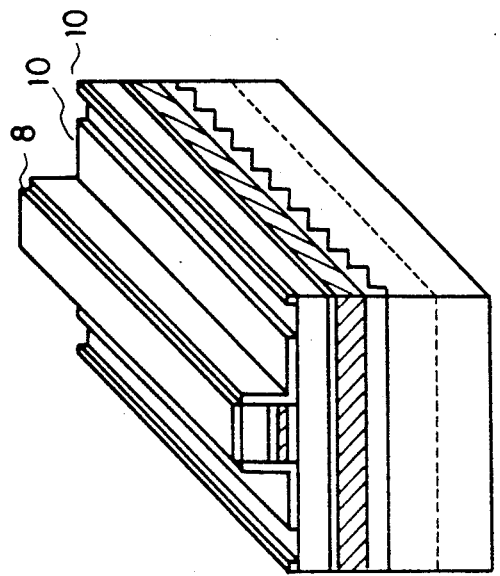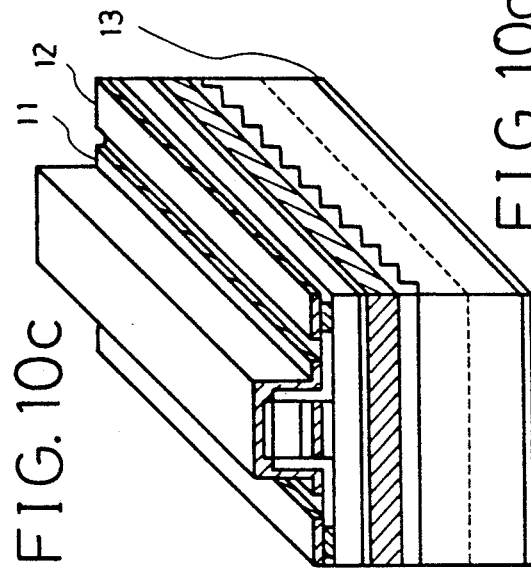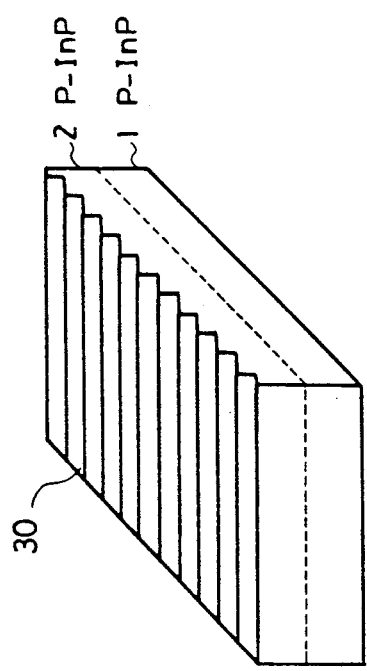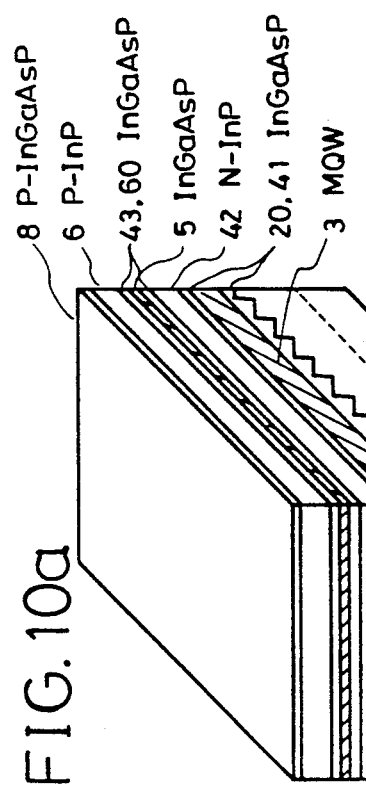
FIG.10a
FIG.10b
FIG.10c
FIG.10d bottom of page 1 / 5,084,894

OPTICAL SEMICONDUCTOR DEVICE

This invention relates to an optical device using alloy semiconductor pn junctions. This invention, more particularly, relates to the structure of a device formed with a layer on the pn junction of a band gap narrower than layers on both sides thereof such as a wavelength tunable laser, a monolithic integrated laser with a phase modulator, a monolithic integrated laser with an optical switch, an optical amplifier, and an optical waveguide.

BACKGROUND OF THE INVENTION

There have been known wavelength tunable lasers and monolithic integrated lasers with an optical switch as semiconductor lasers integrated with modulators.

FIGS. 1 and 4 show typical structures of wavelength tunable lasers.

A wavelength tunable laser basically includes a diffractive grating on the same layer as the one forming an optical waveguide, and changes the wavelength of light reflected from the diffractive grating by varying the refractive index thereof to thereby tune the lasing wavelength.

The device shown in FIG. 1 is a wavelength tunable, multiple-electrode-distributed Bragg reflector (DBR) laser diode wherein an optical waveguide layer 132 is provided between two semiconductor layers 131 and 134 of different conductivity of p or n, an active layer 133 is provided in a region on an end of the optical waveguide layer 132, and a diffractive grating 135 is provided on the other end thereof. The electrodes of the device are divided in three regions. The first electrode 136 is provided on the region of the active layer 133 in order to supply electric current required for lasing. The second electrode 137 is formed on a region where no active layer 133 nor diffractive grating 135 is provided. The third electrode 138 is provided on a region of the diffractive grating 135.

The device is of a pn structure entirely in the vertical direction, and therefore can change the carrier density on the optical waveguide 132 by the electric current passed through the pn structure to eventually change the refractive index. Such change in the refractive index is known as plasma effect.

FIGS. 2 and 3 show examples of changes in the spectral line width and the lasing wavelength as against the electric current $I_p+I_b$ passed through the electrodes 137 and 138 respectively. In these examples, by changing the electric current $I_p+I_b$ by 70 mA, it can vary wavelength by 3.1 nm (or 380 GHz in frequency). The structure and characteristics of the device are taught by S. Murata et al., Electron Lett., Vol. 23, p. 403, 1987.

The device shown in FIG. 4 is a wavelength tunable multiple-electrode distributed feedback (DFB) laser diode wherein an active layer 162 is provided between two semiconductor layers 161 and 163 having different conductivity of p or n, and a diffractive grating 164 is provided along the active layer 162. Electrodes of the device are divided into an electrode 165 for lasing and an electrode 166 for controlling the refractive index in the direction of beams. An anti-reflection coating 167 is formed at an emergent end.

The device is described in detail by M. Kuznetsov, in IEEE. QE-24, No. 9. p. 1837, Sept. 1988.

Similarly to the wavelength tunable multiple electrode distributed Bragg reflector (DBR) laser diode, the device changes the carrier density by the electric currents $I_1$, $I_2$ of electrodes 165, 166 to thereby vary the refractive index. The lasing wavelength is controlled with the electric current $I_2$ of the electrode 166 for controlling the refractive index while maintaining the total injection current $I_t = I_1 + I_2$ constant.

FIG. 5 shows an example of the spectral line width electrodes 165 and 166. The characteristics thereof are disclosed by Kenji Sato et al. in OFC' 89, Feb. 1989, TUH 3.

There is also known an integrated laser with an optical modulator which does not use the plasma effect caused by injection of electric current. FIGS. 6, 7a and 7b show such an example.

FIG. 6 shows the structure of an integrated laser with an optical switch using a multiple quantum well structure in the modulator thereof. The figure is partially broken away in order to show the interior structure The device can change the intensity of light at a high speed by changing optical characteristics (absorption) of the optical waveguide by applying an electric field on the multiple quantum well structure (MQW). The device is taught by Y. Kuwamura, K. Wakita et al. in OQE 86-169.

FIGS. 7a and 7b show energy band structures of a laser having a pnp transistor structure (npn would be similar to that shown in the figures). Corresponding to the transistor, respective layers are made an emitter, a base and a collector. FIG. 7a shows the state where no electric voltage is applied between the base and the collector while FIG. 7b shows the state applied with voltage.

This device uses a pn junction between the emitter and the base as an active layer, and forms an optical gain layer for lasing by injecting the electric current thereto in forward bias. By varying the bias applied between the base and the collector, the carrier confinement effect of the active layer is varied to change the optical gain. This permits modulation of light intensity.

Those devices are described by Suga, Yamanishi et al. in the Proceedings of 1988 Autum Conference of Applied Physics Association, Article No. 5a-R-6.

However, the wavelength tunable multiple-electrode DBR laser diodes are defective in that if the lasing wavelength changes because of the plasma effect, it not only changes the refractive index but also increases the optical absorption and heat generation by free carriers to change the threshold gains of laser, to lower the optical output or to increase the spectral line width as shown in FIG. 5.

In the case of a wavelength tunable multiple-electrode DFB laser diode, as the optical absorption hardly changes in a resonator as a whole, even if the lasing wavelength is varied, it would not change the optical output or the spectral line width. But when electric current for controlling the refractive index $I_2$ increases beyond the lasing threshold current, almost all of the injected electric current is consumed for the increment in optical output, and the carrier density ceases to change. This inconveniently limits the tunable width of lasing wavelength.

Further, the conventional integrated laser with optical modulator is complicated in structure, and hence the manufacture process is complex and difficult.

OBJECTS OF THE INVENTION

This invention aims to solve the foregoing problems encountered in the prior art and to provide a wavelength tunable laser, a monolithic integrated laser with a phase modulator or a monolithic integrated laser with an optical switch which is stable in optical output and lasing wavelength, narrow in spectral line width, superior in separation characteristics of the electrodes thereof, and simple in structure and manufacturing process.

SUMMARY OF THE INVENTION

The first aspect of this invention provides an optical device which includes an optical laser and an optical amplifier having a first pn structure including two semiconductor layers of different conduction type, and formed between the two semiconductor layers an active layer having a band gap energy narrower than those two semiconductor layers, which is characterized in that a second pn structure which shares one of those semiconductor layers and includes a third semiconductor layer is provided within the same optical waveguide structure on the side opposite the other one of the first two semiconductor layers to form a pnp or an npn structure with the first pn structure, and a layer disposed at the pn junction of the second pn structure and having a band gap energy narrower than the semiconductor layers forming the second pn structure.

By laminating another pn structure on one of the semiconductor layers of a pn structure, a pnp or an npn structure may be formed as above indicated. In the structure, the optical output can be controlled by the electric current passed into the pn junction including the active layer, and the lasing wavelength, the light intensity or the light phase can be controlled by the electric field applied or electric current injected into the other pn junction.

The second aspect of this invention provides a semiconductor laser having a high resistance layer between an n-layer on which the pnp structure is buried and at least one of the p-layers in the case of pnp structure and between the p-layer on which the npn structure is buried and at least one of the n-layers in the case of an npn structure.

The high resistance layer may be a layer having an electric resistance increased by ion injection of impurities or a pn junction of reverse bias.

When a pn junction is used as the high resistance layer, it is preferable to provide an n-type layer in the p-type layer in the case of a pnp structure or a p-type layer within the n-type layer in the case of an npn structure.

In the semiconductor lasers of pnp structure, bias current is passed from the p-layers on both sides into the n-layer. In order to guide the electric current into the electrode on the surface of the device, it is necessary to bury at least one of the pn-structures of the pnp structure as the n-type layer. However, if it is buried as it is, a parasitic pn junction will be formed between the outer p-layer and the buried n-layer in forward bias to thereby cause an unnecessary flow of electric current in operation.

Therefore, it is necessary to separate electrically (in DC) two layers by providing a high resistance layer or a pn junction of reverse bias between the p-layer and the n-layer thereby to reduce waste current which would otherwise be caused by the parasitic pn junction.

In an npn semiconductor laser, the same problem occurs, and it becomes necessary to provide a pn junction for reverse bias or a high resistance layer between the outer n-layer and the buried p-layer to reduce the parasitic current passing through the n-layer from the buried layer.

The third aspect of this invention provides an optical semiconductor device including first and second semiconductor layers of different conduction type, and a third semiconductor layer having a band gap energy narrower than those of the other two semiconductors, which is characterized in that a fourth semiconductor layer is formed between (1) at least one of the first and second semiconductor layers and (2) the third semiconductor layer and the fourth semiconductor layer has a band gap energy narrower than that of the third semiconductor and a thickness which is smaller but sufficient not to deteriorate substantially the carrier confinement effect by the third semiconductor layer.

Inserting the third semiconductor layer of a narrower band gap energy between the two semiconductor layers of different conduction type, it becomes possible to inject the carriers into the third layer quite effectively. Moreover, another semiconductor layer having a still narrower band gap energy is inserted between the third layer and the sandwiching layers. In this structure, carriers injected into the third semiconductor layer from a layer of a wider band gap energy cannot travel beyond the energy barrier formed by the fourth semiconductor layer inserted therebetween. This improves the carrier injection efficiency.

However, if the fourth semiconductor is thick, injected carriers are confined in the fourth semiconductor layer of a shorter carrier life rather than in the third semiconductor layer, or absorption in the fourth layer sometimes increases the optical loss. In order to prevent these inconveniences, the thickness of the fourth semiconductor layer should be reduced so as to prevent decrease of carrier life or increase in optical loss.

The structure where carriers are injected from a layer of a wider band gap into a layer of a narrower band gap is not only applicable to modulation layers for semiconductor lasers but also to other optical semiconductor devices. For example, the refractive index of the optical waveguide of a narrower band gap may be changed by injection of carriers in order to control phases. This is also applicable to an optical switch using changes in refractive index.

The fourth aspect of this invention provides an optical semiconductor device having a first pn structure including two semiconductor layers of different conduction type, and a first active layer formed between the two semiconductor layers and having a band gap energy narrower than that of the two layers, which is characterized in that a second pn structure is provided within the same optical waveguide structure on the side of one of the two semiconductor layers to form a pnp structure or an npn structure with the first pn structure, and a second active layer is formed in the pn junction of the second pn structure having a band gap energy which is narrower than those of the semiconductor layers on both sides thereof and is different from that of the first active layer.

An alloy semiconductor is added with impurities so as to obtain a pnp or an npn structure, and active layers of composition of a narrower band gap energy are formed on the two pn junctions respectively. The band gap energies of the two active layers should be slightly different from each other. This enables separate and independent control of optical gain spectrum of the active layers when carriers are injected therein. As the optical gain spectrum of the device as a whole is substantially equivalent to the superposition of the two optical gain spectra, this eventually enables electric control of the optical gain spectrum of the device.

BRIEF DESCRIPTION OF THE DRAWINGS

FIG. 6 is a partially broken away perspective view showing a prior art integrated laser with an optical modulator using multiple quantum well structure as the modulator.

FIG. 7a and 7b show energy band structures of a prior art laser device having a transistor structure.

FIG. 10a through 10d show the manufacturing procedure.

DESCRIPTION OF PREFERRED EMBODIMENTS

First Embodiment

Figure 1:
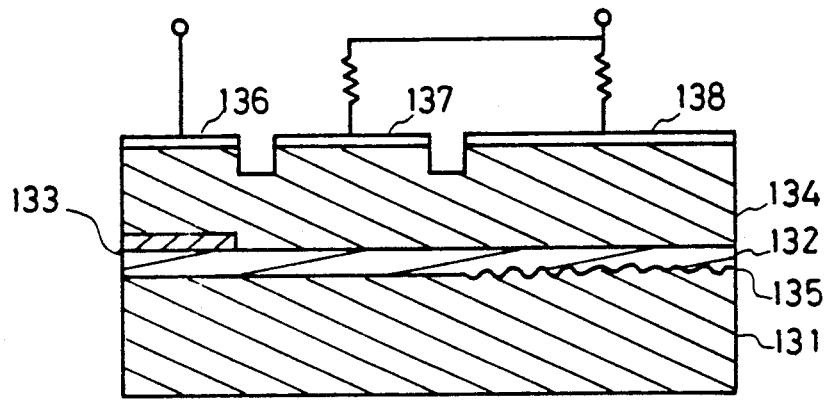
FIG. 1 is a sectional view of a prior art wavelength tunable multiple electrode DBR laser diode structure in the direction along the waveguide.
Figure 2:
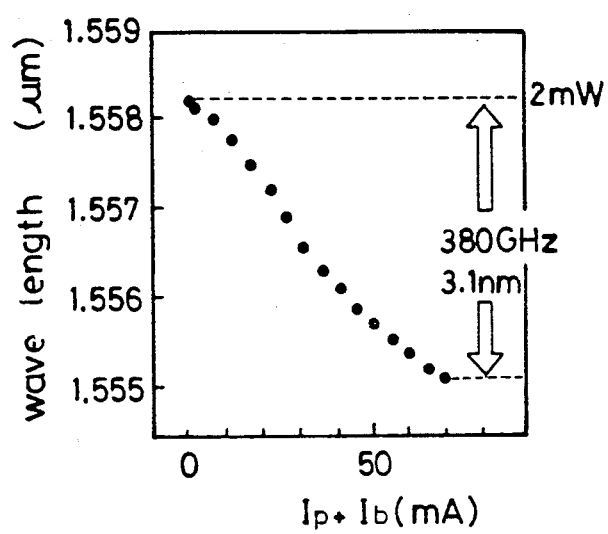
FIG. 2 is a graph showing changes of lasing wavelength against the bias current in the device.
Figure 3:
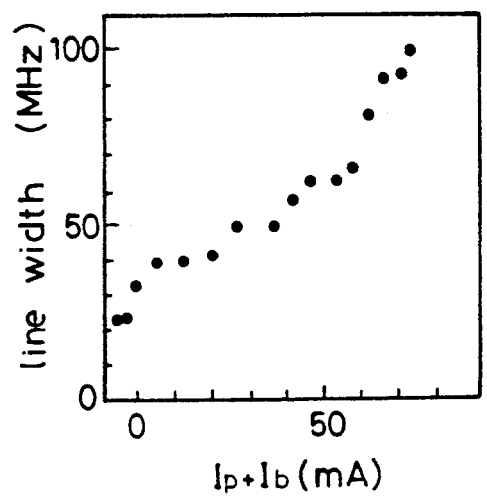
FIG. 3 is a graph showing changes of lasing spectral line width against the bias current in the device.
Figure 4:
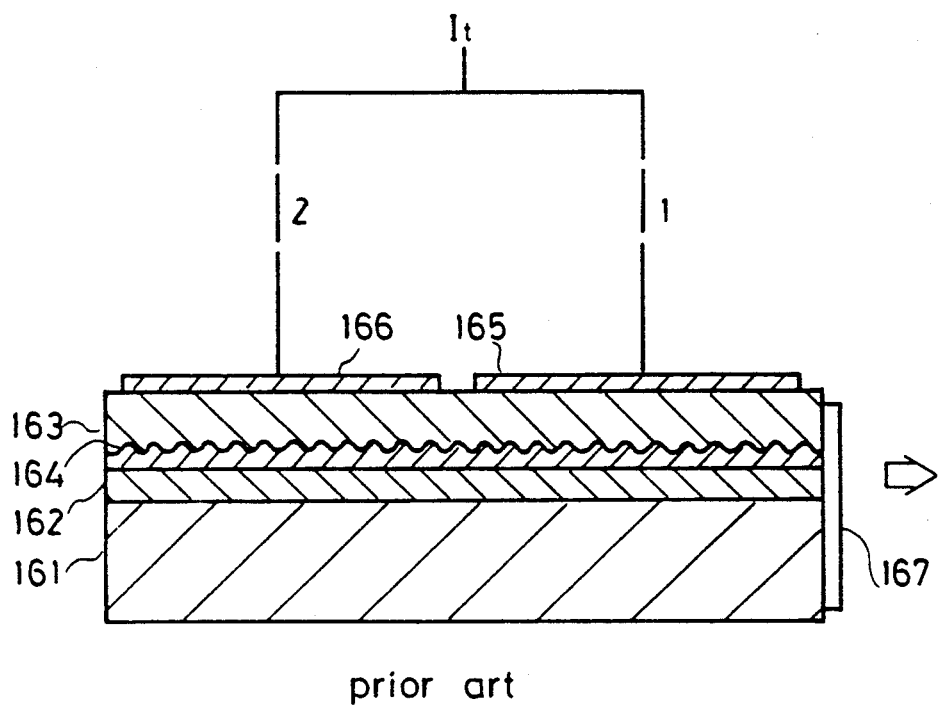
FIG. 4 is a sectional view showing a prior art wavelength tunable multiple electrode DFB laser diode in the direction along the waveguide.
Figure 5:
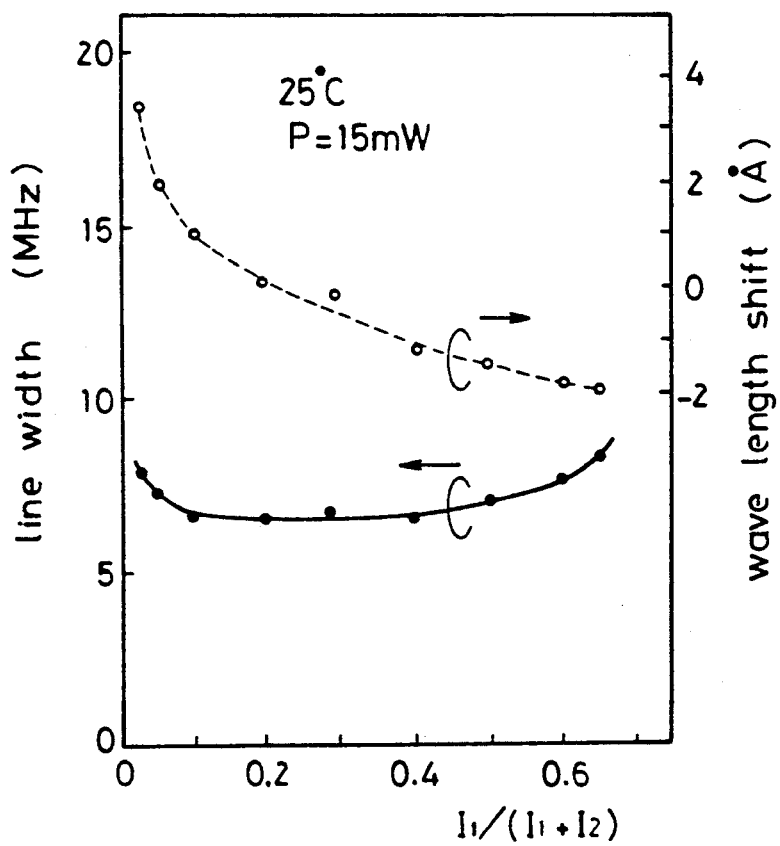
FIG. 5 is a graph showing an example of lasing wavelength and spectral line width against the bias current ratio of the device.
Figure 8:
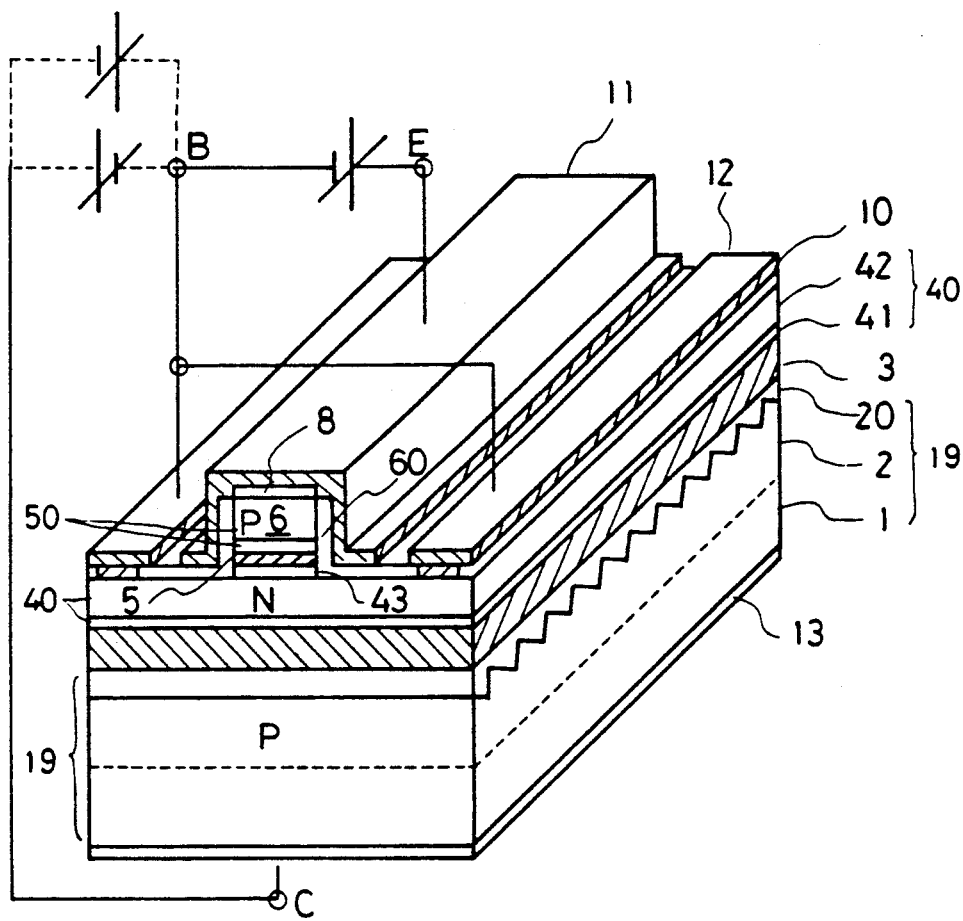
FIG. 8 is a perspective view showing the first embodiment of this invention's semiconductor laser.

FIG. 8 is a perspective view showing the first embodiment of this invention's semiconductor laser.

This semiconductor laser is an application of this invention to a wavelength tunable laser diode wherein there is a first pn structure including two semiconductor layers of different conductivity: an n-layer 40 comprising a base layer 42 and a guide layer 41, and a p-layer 50 comprising a guide layer 60 and a cladding layer 6. Formed between a guide layer 43 and a guide layer 60 is an active layer 5 having a band gap energy narrower than those two semiconductor layers 40 and 50.

The guide layer 43, the active layer 5, the guide layer 60 and the cladding layer 6 are formed in mesa, and the cladding layer 6 is connected to an electrode 11 via a capping layer (contact layer) 8. The sides and trail regions of the mesa structures are coated with an insulating layer 10.

This embodiment is characterized in that a second pn structure, which shares one of the semiconductor layers of the first pn structure, forms an npn structure or as shown in FIG. 8 a pnp structure. The second p-layer 19 includes a substrate 1, a buffer layer 2 and a guide layer 20, and the second pn structure shares with the first pn structure the n-layer 40 which comprises guide layer 41 and base layer 42. The second p-layer 19 is within the same waveguide structure and on the side of one of the two semiconductor layers (the base layer 42). A modulation layer 3 which has a band gap energy narrower than the guide layers 20 and 41 is disposed between those guide layers at the pn junction of the second pn structure.

The base layer 42 is connected to an electrode 12 via a window opened on the insulating layer 10. Another electrode 13 is provided on the other surface of the substrate 1.

As this structure is similar to that of a hetero-junction bipolar transistor (HBT), the p-layer 50 including the cladding layer 6 will be referred to as an emitter, the n-layer 40 including the base layer 42 as a base and the p-layer 19 including the buffer layer 2 as a collector herein, as in the case of an HBT. The significant difference in structure from an HBT lies in that layers of a narrow band gap are inserted in the junctions of the emitter-base and the base-collector. The space between the modulator layer 3 and the active layer 5 will be referred to herein as a separating layer generally.

Figure 9:
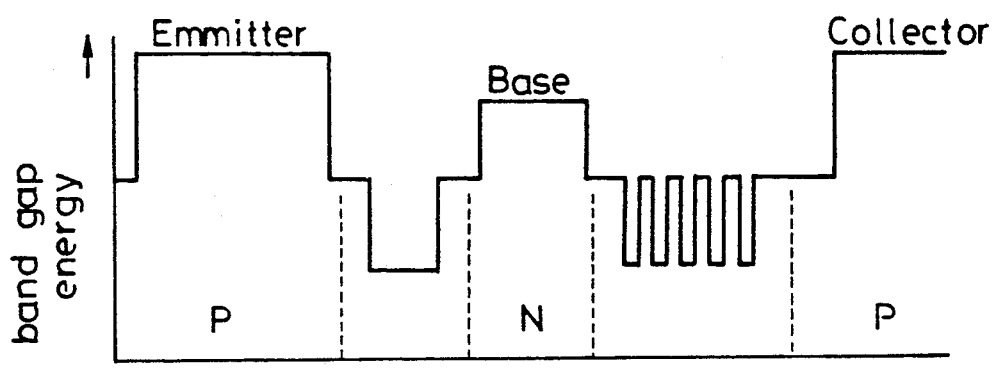
FIG. 9 is a view to show the energy band structure of the semiconductor laser.

FIG. 9 shows the energy band structure of this semiconductor laser. In this case, a multiple quantum well structure is employed as the modulation layer 3.

FIGS. 10a through 10d show the manufacturing process of this semiconductor laser. The description will exemplify a pnp structure using crystals of InP and InGaAsP. The terms upward, on or above and downward or below herein respectively mean the direction away from the substrate and the direction approaching the substrate in the following description.

As shown in FIG. 10a, a p-type InP buffer layer 2 is epitaxially grown on a p-type InP substrate, and on the buffer layer 2 is formed a diffractive grating 30 aligned with the lasing wavelength by optical holographic lithography or the like method.

As shown in FIG. 10b, a p-type (or non-doped) InGaAsP guide layer 20, non-doped InGaAsP/InGaAs multiple quantum well modulation layer 3, an n-type (or non-doped) InGaAs guide layer 41, an n-type InP base layer 42, an n-type (or non-doped) InGaAsP guide layer 43, a non-doped InGaAsP active layer 5, a p-type (or non-doped) InGaAsP guide layer 60, a p-type InP cladding layer 6, a p+ type InGaAsP capping layer 8 are epitaxially grown in the above order on the buffer layer 2.

Subsequently, as shown in FIG. 10c, a capping layer 8, a cladding layer 6, a guide layer 60, an active layer 5 and a guide layer 43 are etched in mesa stripe to expose the base layer 42. An insulating layer 10 is formed with insulating substance such as $SiO_2$ and a window is opened by etching to connect electrodes to an emitter and a base.

Then, as shown in FIG. 10d, electrodes 11, 12 are formed by the lift-off method or the like using metals suitable to the type of impurities of the emitter and the base respectively. Another electrode 13 is formed on the reverse side of the substrate 1. Lastly, annealing is given for alloying the electrodes 11, 12 and 13.

When using the semiconductor laser, a forward bias is applied between the electrodes 11 and 12 (or between the emitter and the base) (the electrode 11 is positive and the electrode 12 negative), and a reverse bias or a weak forward bias is applied between the electrodes 12 and 13 (between the base and the collector) (the electrode 12 is positive, and the electrode 13 negative).

Figure 11:
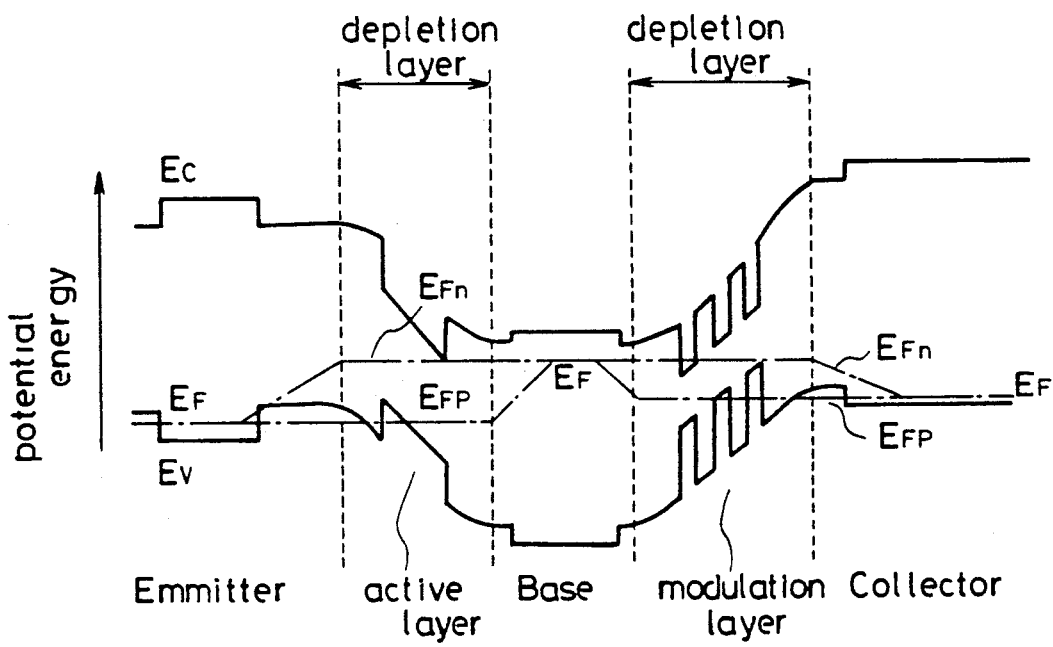
FIG. 11 shows the energy band structure.

FIG. 11 shows the energy band structure when forward bias is applied between the emitter and the base and a forward bias which is weak enough not to pass electric current is applied between the base and the collector.

Under these conditions, electrons and holes are injected from the emitter and the base into the active layer 5 with a narrow band gap and temporarily confined. As active layer 5 and the guide layers 43 and 60 have not only narrow band gaps but also high refractive indexes (i.e., higher than surrounding elements, e.g., 3.4–3.56 compared to 3.16 for InP layers 6 and 12), photons are confined in the locality. Light emission or lasing occurs on the active layer 5 due to the interaction among the electrons, holes and photons.

Description will now be given to the optical modulation characteristics by the modulation layer 3 between the base and the collector.

Figures 12A, 12B:
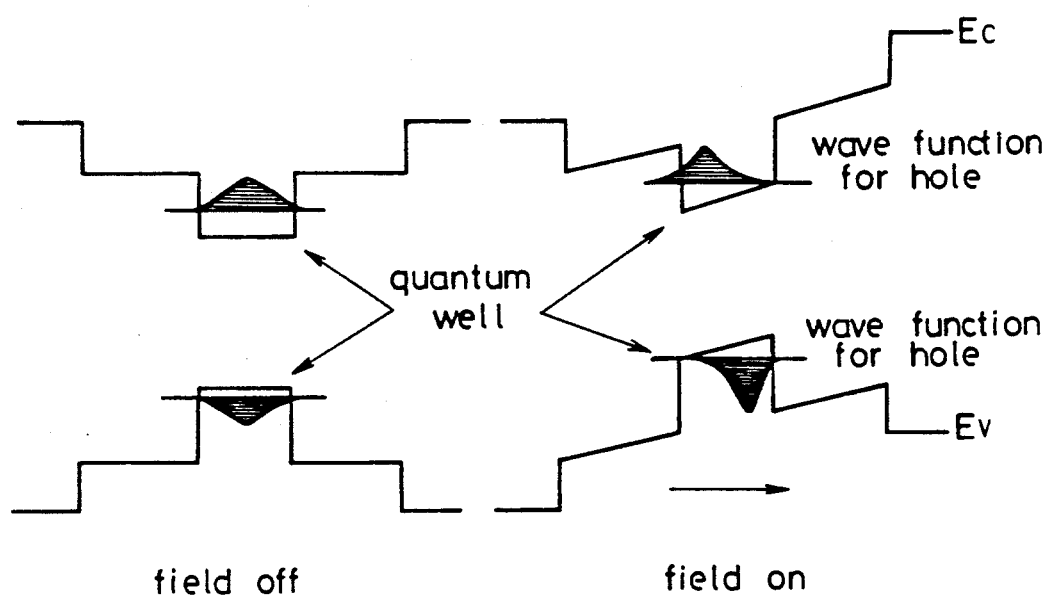
FIGS. 12a and 12b show changes in energy band and in wave function caused by an electric field applied on the layer of a low impurity density with a quantum well structure.

FIGS. 12a and 12b are graphs showing changes in energy band and wave functions caused by the electric field applied on the low impurity density layers having a quantum well structure. FIG. 12a shows the state without application of electric field, and FIG. 12b the state with application. Although the graphs show the cases of single quantum well, the same can be applied to the cases of multiple quantum well.

When an electric field is applied on the low impurity density layer with quantum well structure, the optical characteristics of the quantum well and particularly the refractive index and absorption coefficient change depending on the degree of wave function overlap. This phenomenon is taught in further detail by H. Yamamoto et al. in IEEE, LT, Vol. 6, No. 12, p. 1831, Dec. 1988.

Therefore, when a bias current is applied between the base and the collector in the embodiment shown in FIG. 8, the optical characteristics of the modulation layer 3 changes. By utilizing the changes in refractive index, the selectivity of reflection wavelength by diffractive grating may be changed to thereby vary lasing wavelength in the active layer 5. As the effective refractive index and light absorption change in the waveguide as a whole, it becomes possible to control intensity or phases of the light.

Figure 13:
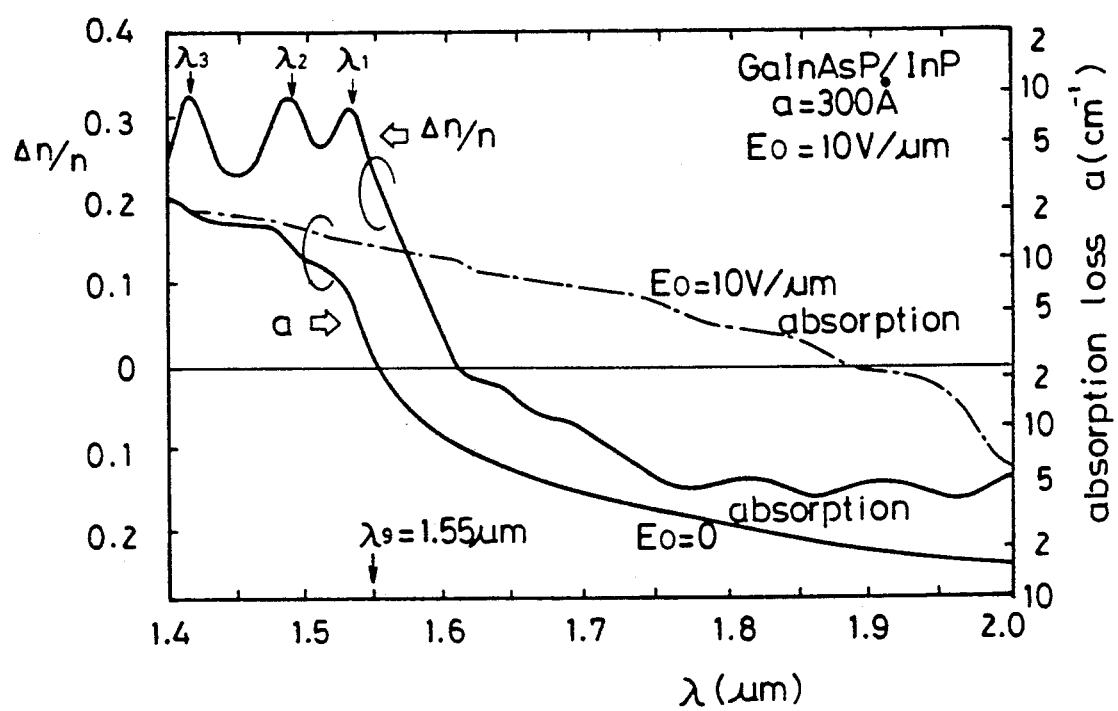
FIG. 13 is a graph showing the result of computation of absorption $\alpha$ and refractive index change $\Delta n/n$ when an electric field is applied in the modulator layer.

FIG. 13 is a graph showing the result of computation of the absorption $\alpha$ and refractive index changes $\Delta n/n$ when an electric field is applied. The values are extracted from the reference by Yamamoto et al. mentioned above.

Accordingly, if the energy band structure of the modulation layer 3 is designed to make the refractive index changes $\Delta n/n$ to be large while the absorption $\alpha$ to be small, a monolithic integrated laser with a phase modulation will be obtained. If it is designed to have small refractive index changes $\Delta n/n$ and a large absorption $\alpha$ by the application of an electric field on the modulation layer 3, a monolithic laser with an optical switch will be obtained. However, it is not necessary to provide a diffractive grating close to the modulation layer 3 if it is used as the monolithic integrated laser with a phase modulator or that with an optical switch. If it is used as a wavelength tunable laser, a diffractive grating should be provided proximal to the modulation layer 3 with the same conditions as that for the monolithic integrated laser with a phase modulator.

Second Embodiment

Figure 14:
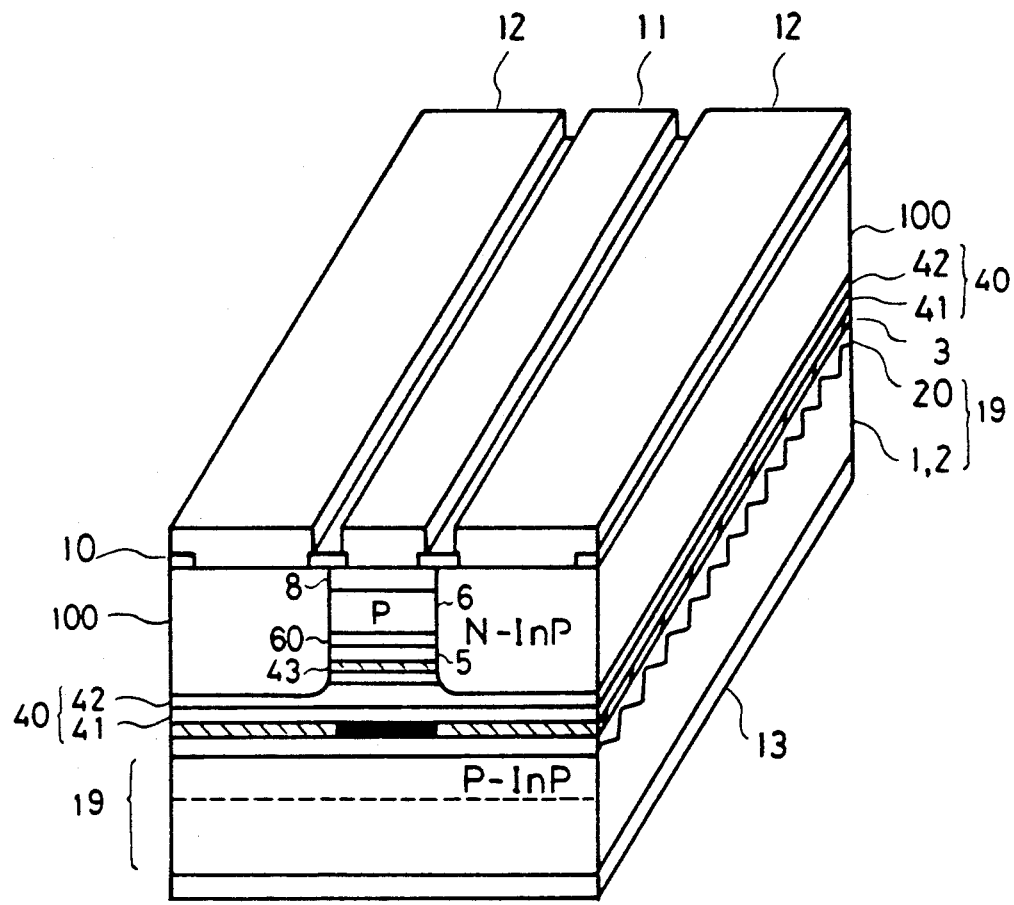
FIG. 14 is a perspective view showing the second embodiment of this invention's semiconductor laser structure.

FIG. 14 is a perspective view showing the structure of a second embodiment of a semiconductor laser according to this invention.

The second embodiment differs from the first embodiment in that the mesa structure including the active layer 5 is buried in an n-type InP layer 100. The insulating layers 10 are provided on the layer 100 and the electrode 12 is connected through a window of the insulating layer 10 on the layer 100. In the active layer 3, the black strip shows the light emitting area.

As this structure has a low refractive index difference in the horizontal direction, even if the stripe width of the mesa is increased, it is possible to confine the single mode light. As the material for the buried layer 100, a material having a larger band gap energy and a smaller refractive index than those of the active layer 5 and the guide layers 43, 60 is suitable.

Third Embodiment

Figure 15:
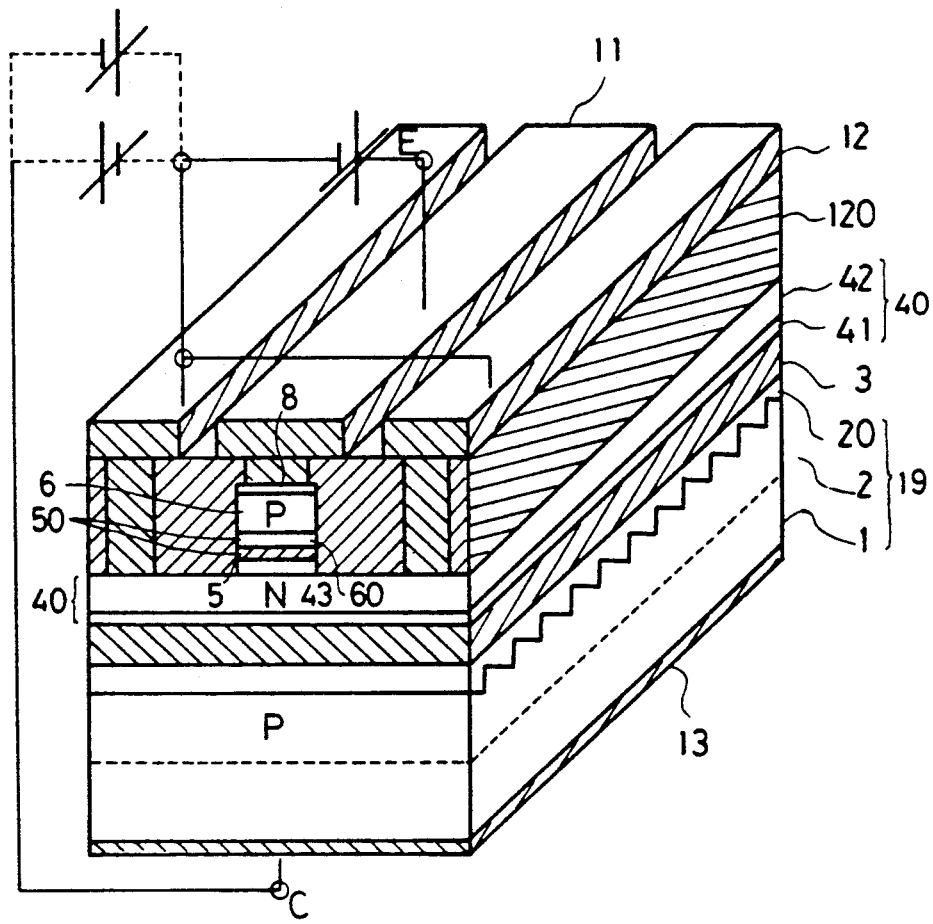
FIG. 15 is a perspective view showing the structure of the third embodiment of this invention's semiconductor laser.

FIG. 15 is a perspective view showing the structure of the third semiconductor laser embodiment of this invention. This embodiment differs from the second embodiment in that a polyamide layer 120 is used as the burying layer. In this case, insulating layers become unnecessary, and the layer 120 is provided with a groove for connecting the electrode 12 to the base layer 42.

Fourth Embodiment

Figure 16:
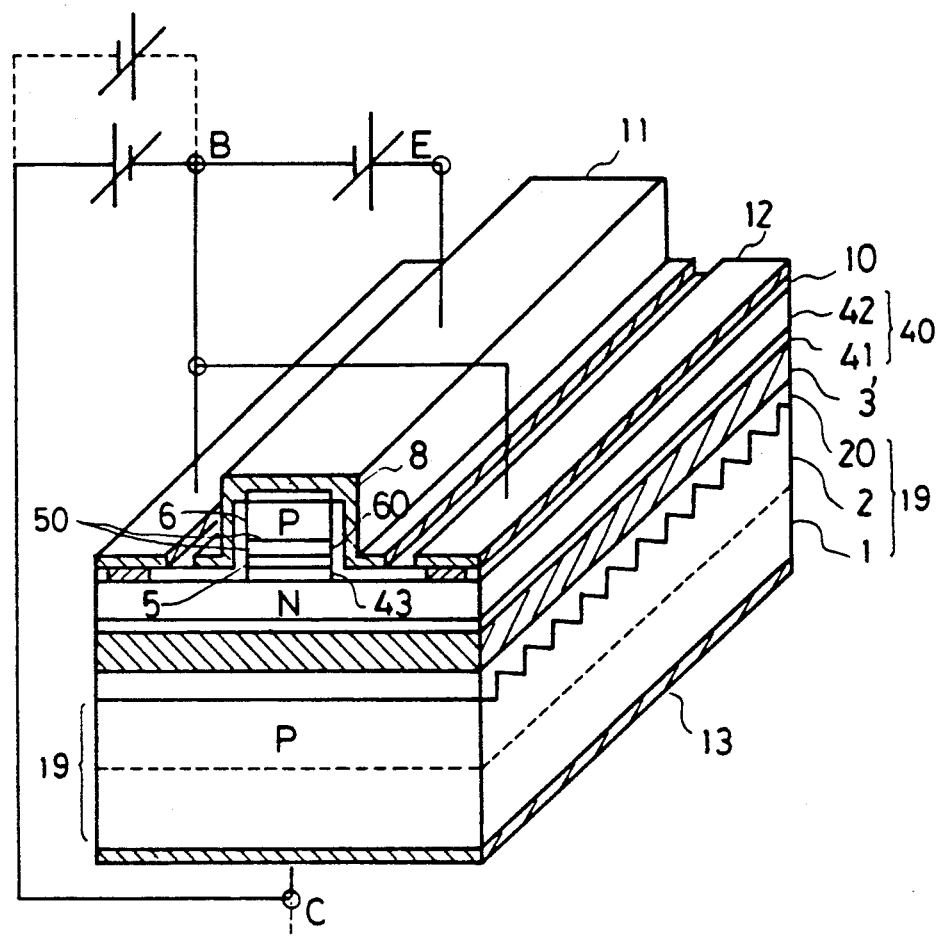
FIG. 16 is a perspective view showing the structure of the fourth embodiment of this invention's semiconductor laser.
Figure 17:
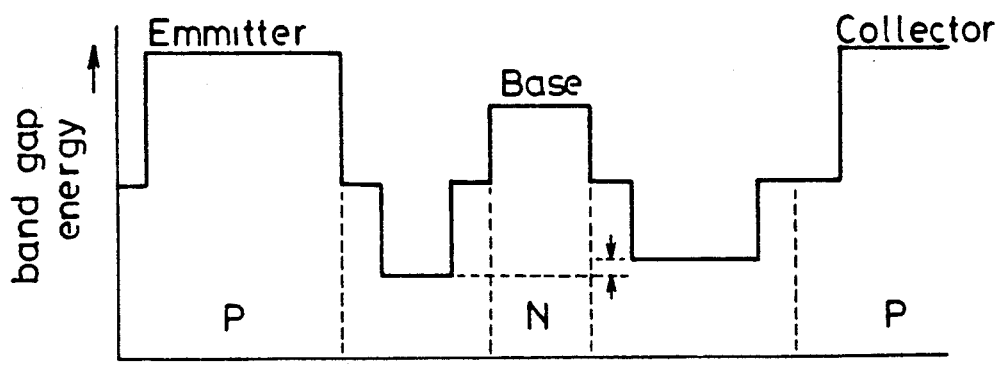
FIG. 17 is a view showing an energy band structure.

FIG. 16 is a perspective view showing the structure of the fourth embodiment of this invention's semiconductor laser and FIG. 17 shows the energy band structure thereof.

In this embodiment, the modulation layer 3 of the first embodiment is replaced with a modulator layer 3' of bulk crystal so that the optical characteristics thereof are changed by the plasma effect due to the electric current injected into the modulation layer 3'. Instead of the reverse bias applied in the modulation layer 3 in the first embodiment 3, forward bias is applied in the modulation layer 3' in this embodiment.

Fifth Embodiment

Figure 18:
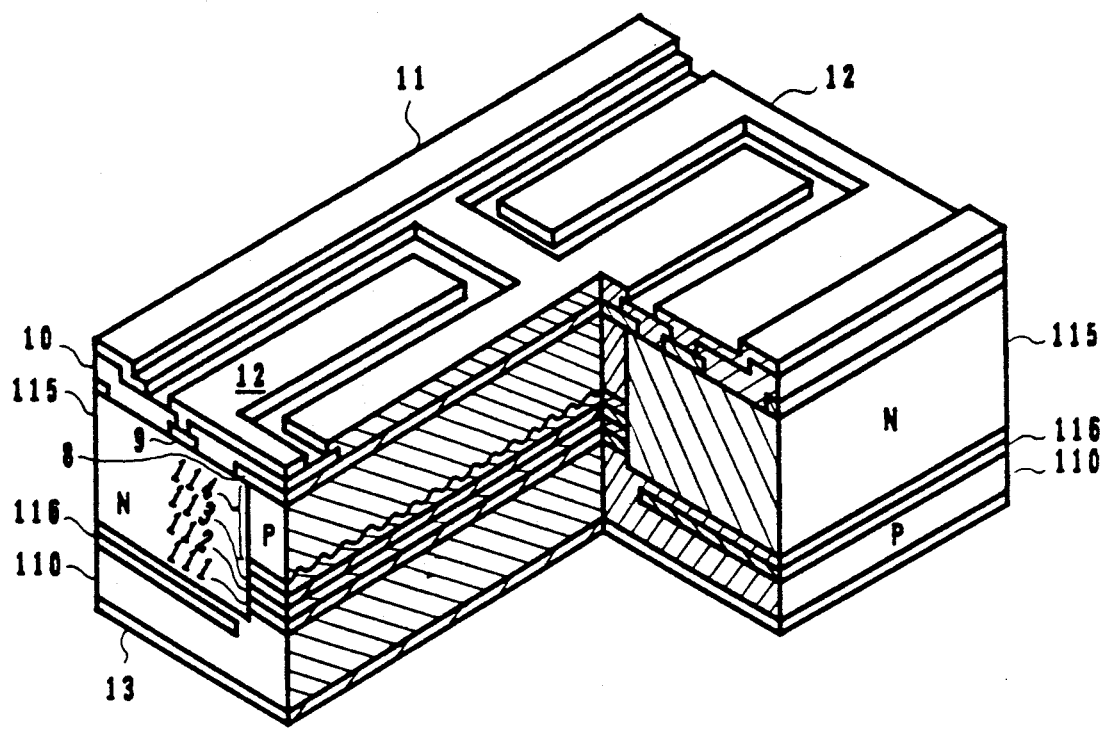
FIG. 18 is a perspective view showing the structure of the fifth embodiment of this invention's semiconductor laser.

FIG. 18 is a perspective view showing the structure of the fifth embodiment of this invention's semiconductor laser.

This embodiment is similar to the fourth embodiment in the plasma effect due to the injection of the electric current into the modulation layer, but differs from it in that it is of a buried type. In this embodiment, the positional relation of the substrate, and electrodes against the active layer and the modulation layer is opposite the aforementioned embodiments.

More specifically, upon a p-type collector layer 110 are provided in mesa structure an active layer 111, an n-type base layer 112, a modulation layer 113, and a p-type emitter layer 114 which includes two layers divided by a corrugated line. This mesa structure is buried in the n-type layer 115. Within the collector layer 110 on both sides are separate, high resistance current block layers 116 of an n-type semiconductor for current constriction.

The emitter layer 114 is connected to an electrode 11 via a p+-type capping layer 8, and the burying layer 115 is connected to the electrode 12 via an n+-type capping layer 9. The electrodes 11, 12 are insulated with an insulating layer 10. An electrode 13 is provided on the reverse side of the collector layer 110.

The collector layer 110 includes the substrate 1, the buffer layer 2 and the guide layer 20 of the above mentioned embodiments, the base layer 112 includes the guide layer 41, the base layer 42 and the guide layer 43, and the emitter layer 114 includes the guide layer 60 with a diffraction grating and the cladding layer 6.

The tunable wavelength characteristics due to the plasma effect will be described below.

Figure 19:
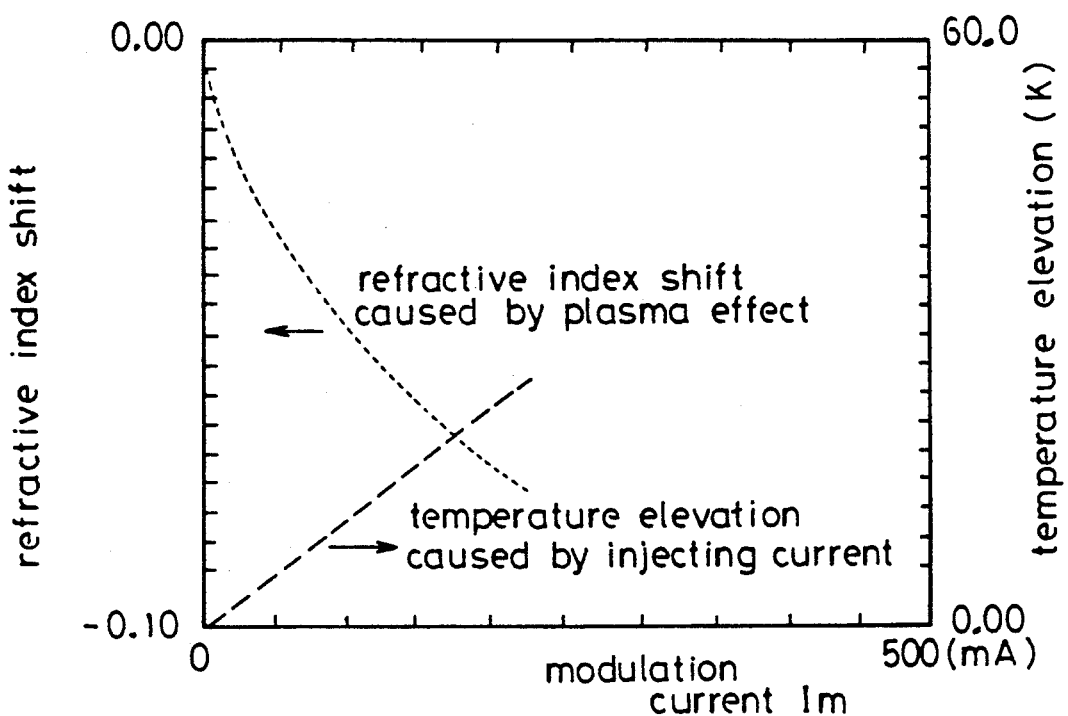
FIG. 19 is a graph showing the changes in refractive index and temperature against modulation current.
Figure 20:
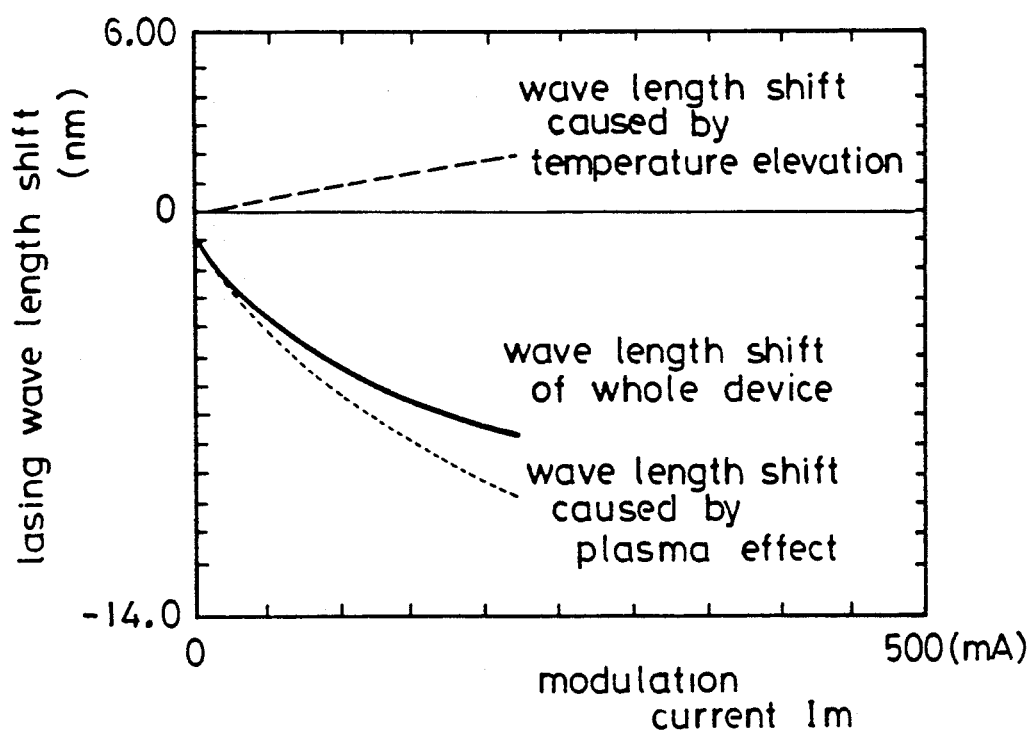
FIG. 20 are graphs showing the changes in lasing wavelength against the modulation current when it is used as a tunable wavelength laser.

FIGS. 19 and 20 are graphs showing theoretically computed values of the effect caused by the modulation current Im which is injected in the modulation layer. More particularly, FIG. 19 shows the changes in temperature and refractive index as against the modulation current $I_m$, and FIG. 20 shows changes in lasing wavelength as against the modulation current Im when used as a wavelength tunable laser. The values are computed in accordance with the following equations assuming that the band gap energy of the modulator layer corresponds to the optical wavelength of 1.3 μm, $$\Delta\lambda = \Delta\lambda_{pl} + \Delta\lambda_{th}$$

$$\lambda_{pl} = \lambda_0 \Gamma (\Delta n / n_0)$$

$$\lambda_{th} = K \cdot \Delta T$$

$$\Delta n = - \frac{q^2 \lambda O^2}{8 \pi^2 n \epsilon_0 c^2} \frac{1}{m^*} N$$

$$N = I_m (\tau_s / q) / V_a$$

$$\tau_s = 33 \times \left[ \frac{1 \times 10^{18}}{N} \right]^{0.8} 10^{-9}$$

wherein
Δλ: changes in lasing wavelength
$\Delta\lambda_{pl}$: changes in wavelength by the plasma effect
$\Delta\lambda_{th}$: changes in wavelength by heat generation
$\lambda_O$: lasing wavelength when not modulated (=1.55 μm)
Γ: optical confinement factor in modulator layer (=24%)
Δn : changes in refractive index due to plasma effect
$n_O$: effective refractive index in the waveguide as a whole
K : 0.09 nm/K
ΔT : temperature increase in the modulation layer
q : element electric charge = $1.6 \times 10^{-19}$(c)
n : refractive index in modulation layer
$\epsilon_O$ : dielectric constant in vacuum
c : optical velocity in vacuum
m* : effective mass of electrons in the modulation layer
N : electron density in the modulation layer (cm$^{-3}$)
$\tau_s$ : life of electrons in the modulation layer (sec.)
$V_a$ : volume of the modulation layer (3 μm in width, 500 μm in length and 0.29 μm in thickness)
$I_m$ : modulation current As illustrated in the figures, when a modulation layer is provided and modulation current is injected therein, although temperature rises due to the electric current, a change in wavelength is caused by the plasma effect more significantly than the wavelength changes due to the temperature rise.

Figure 21:
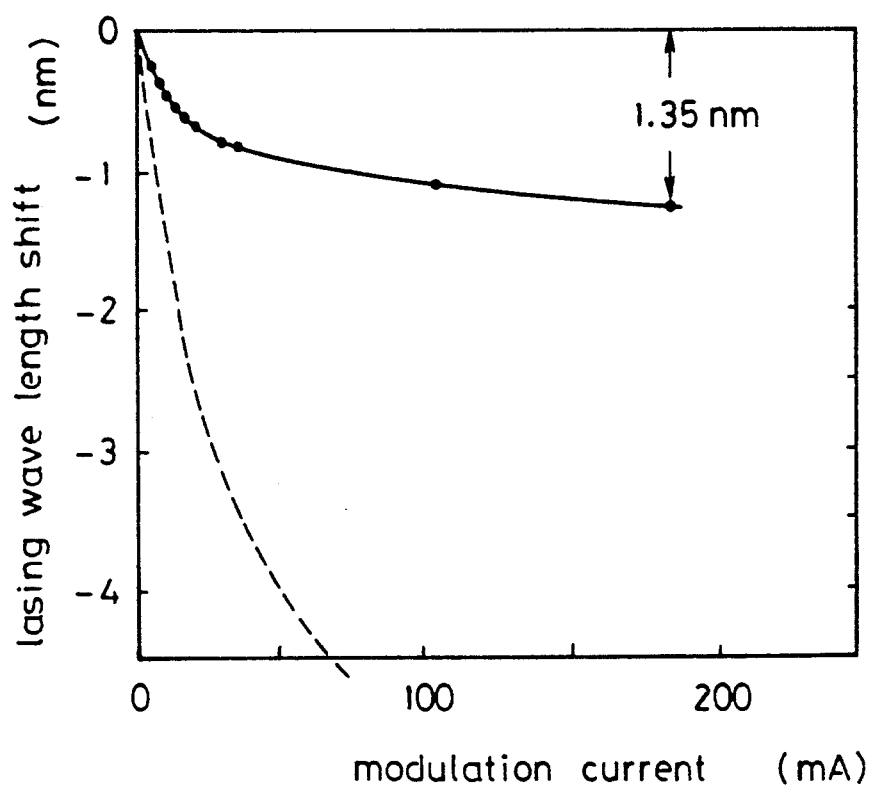
FIG. 21 is a graph showing tunable wavelength characteristics of a semiconductor laser which has been manufactured on a trial basis.

FIG. 21 shows the wavelength tuning characteristics of a semiconductor laser experimentally manufactured. As no diffractive grating was formed in the waveguide in the device which was manufactured on a trial basis, the laser was generated in the Fabry-Perot mode. Wavelength tuning characteristics were measured of a specific mode among them. In the graph, the horizontal axis plots modulation current injected in the modulation layer while the vertical axis plots the changes in lasing wavelength. The solid line denotes the actually measured values, and the broken line the theoretical values.

For the measurement, the fifth embodiment shown in FIG. 18 was used under the following conditions:

The active layer: multiple quantum well structures of two types of materials having the band gap energies corresponding to optical wavelengths of 1.64 $\mu/m$ and 1.3 $\mu m$ respectively.

The base layer an n-type InP of the thickness of 0.2 $\mu m$.

The modulator layer : InGaAsP layer having the composition of the band gap energy equivalent to the optical wavelength of 1.3 $\mu m$.

The width of the mesa structure stripe was measured to be 2.3 $\mu m$. The lasing wavelength was 1.58 $\mu m$, the threshold current $I_{th}$ 30 mA and the tunable wavelength width 1.35 $\mu m$. For the measurement shown in FIG. 21, the driving current for lasing $I_d$ was fixed at a level 2.3 times of the threshold current $I_{th}$.

The large difference between the actual and the theoretical values is attributed to a large leakage current on the surface to the upper pn junction of an element which was made in a trial production and to inefficient injection of the modulation current into the modulation layer.

As described in the foregoing, the first through the fifth embodiments of this invention's conductor lasers are substantially similar in structure to each other, and may be used as a wavelength tunable laser, a monolithic integrated laser with a phase modulator or a monolithic integrated laser with an optical switch.

When used as a wavelength tunable laser, this invention extends the active layer having the optical gain across the resonator as well as reduces the carrier density at the lasing threshold level of the laser. It is quite effective in reducing the lasing threshold and spectral line width as well as in increasing tunable width. As it can form diffractive grating all over the resonator, it does not require a region for phase control unlike a DBR type laser. It can change lasing wavelength continuously without mode hopping simply by injecting electric current or applying electric voltage in the modulation layer.

When used as a wavelength tunable laser, a monolithic integrated laser with a phase modulator or a monolithic integrated laser with an optical switch, unlike the conventional type lasers which need to separate electrically the regions in which impurities of the same type are doped and can not quite fully obtain separation characteristics among devices, devices according to this invention can electrically separate devices fully because semiconductors which are connected to electrodes are fully separated by pn junctions.

In the above embodiments, as shown by the second embodiment (FIG. 14), the active layer and the modulation layer are buried in an InP layer having a wider band gap energy than these, and structured to constrict the electric current injected into the active and modulation layers with the difference in band gap energy. A parasitic pn junction may possibly be formed between the outer layer (p-type layer of the pnp structure and n-type layer in the npn layer of the pnp structure) and the buried layer. This produces an unnecessary electric current component to create a factor of deterioration in threshold current or modulation characteristics. Description will now be given to an embodiment where such possibility is obviated.

Sixth Embodiment

Figure 22:
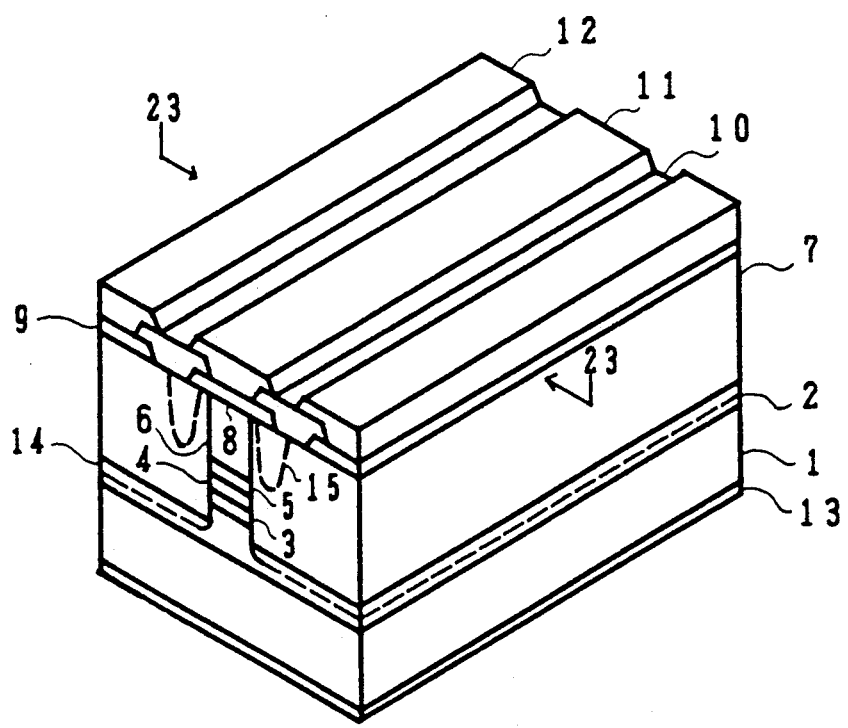
FIG. 22 is a perspective view showing the sixth embodiment of this invention's semiconductor laser.
Figure 23:
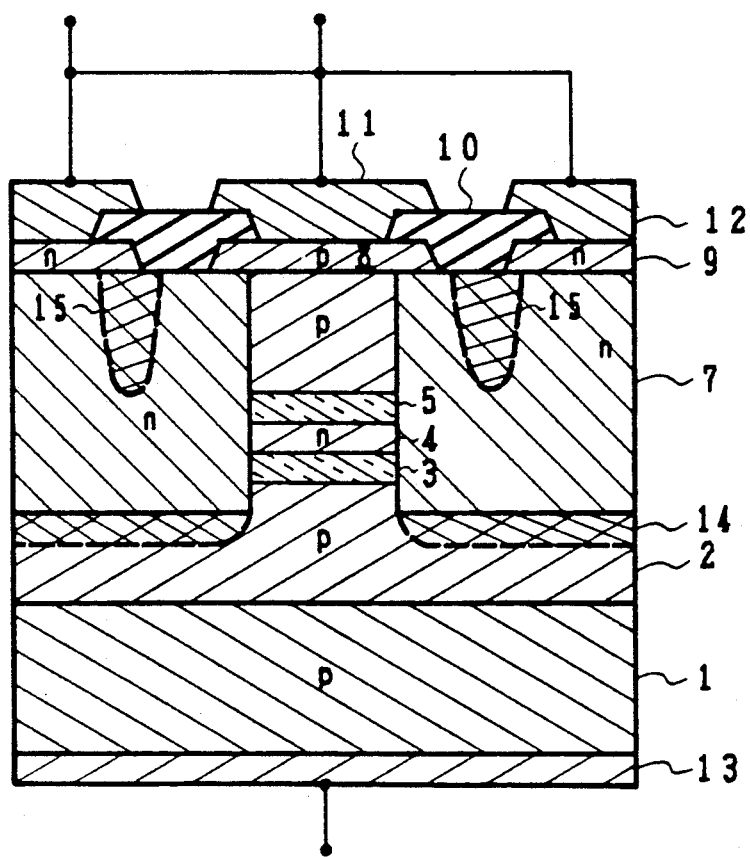
FIG. 23 is a sectional view of the semiconductor laser of FIG. 22 along the line 23—23.

FIG. 22 shows a perspective view of the sixth embodiment of the semiconductor laser of this invention, and FIG. 23 the same embodiment in section along the 23—23 line of FIG. 22 which is perpendicular to the waveguide direction. In this embodiment, the description refers to a semiconductor laser having a pnp structure.

This semiconductor laser has an InGaAsP active layer 5 and an InGaAsP modulation layer 3 one of which is formed as an adjacent active layer with a narrow band gap energy, and an n-type InP base layer 4 provided between the two layers as a separating semiconductor layer. As the two outer semiconductor layers of different conductivity form those layers on both sides of the active and modulation layers 5 and 3, a p-type InP buffer layer 2 and a p-type InP substrate 1 are provided on one side, and a p-type InP cladding layer 6 on the other side. The semiconductor also includes an n-type InP burying layer 7 which buries at least the separating layer 4, a part of the p-type InP buffer layer 2 in this embodiment, the modulation layer 3, the base layer 4, the active layer 5 and the cladding layer 6.

The band gap energy of the active layer 5 is designed to be narrower than that of the modulation layer 3 in order not to absorb the lased light in the layer 3.

This embodiment is characterized in that high resistance layers 14, 15 are respectively provided between the burying layer 7 and the buffer layer 2 and between the burying layer 7 and the cladding layer 6, or more specifically on a part of the buffer layer 2 and a part of the burying layer 7.

The resistance of layers 14 and 15 is much higher than adjacent current passing areas, e.g., several hundred to second tens of megohms compared to 5-10 ohms.

In order to activate the semiconductor layer, carriers are injected into the active layer 5 by the electric current flowing from the electrode 11 to the contact layer 8, the cladding layer 6, the active layer 5, the burying layer 7 and the contact layer 9 to the electrode 12. Moreover, the carrier density on the modulation layer 3 is controlled by the electric current passing from the electrode 13 to the substrate 1, the buffer layer 2, the modulation layer 3, the base layer 4, the burying layer 7 and the contact 9 to the electrode 12 so as to change the refractive index and absorption coefficient by the plasma effect and modulate the laser light.

FIG. 24 shows the manufacturing procedure of this semiconductor laser.

Figure 24A:
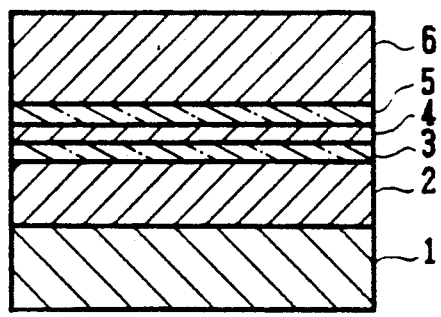
FIGS. 24a to 24e show the manufacturing procedure of the sixth embodiment.

As shown in FIG. 24a, upon a p-type InP substrate 1 are grown epitaxially and sequentially in this order a buffer layer 2 (p-type InP), a modulation layer 3 (low-doped InGaAsP), a base layer 4 (n-type InP), an active layer 5 (low-doped InGaAsP) and a cladding layer 6 (p-type InP) to form a pnp structure.

Figure 24D:
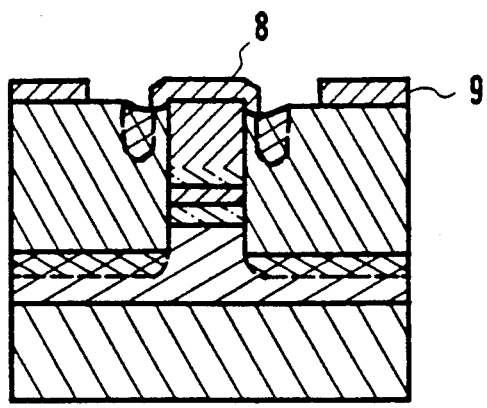
Figure 24B:
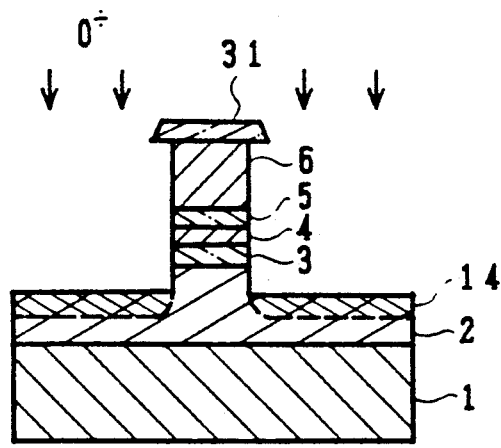

Then, as shown in FIG. 24b, an $SiO_2$ film is deposited on the surface of the cladding layer 6 by plasma CVD or the like method, and a striped $SiO_2$ mask 31 is formed therewith by photo-etching. Using the $SiO_2$ mask 31, the structure is etched to expose a part of the buffer layer 2 to form mesa stripes, and $O^+$ or $Fe^+$ ions are injected while leaving the $SiO_2$ mask 31 intact. This causes the surface of the buffer layer 2 to be self-aligned in mesa to become a high resistance layer 14.

Figure 24E:
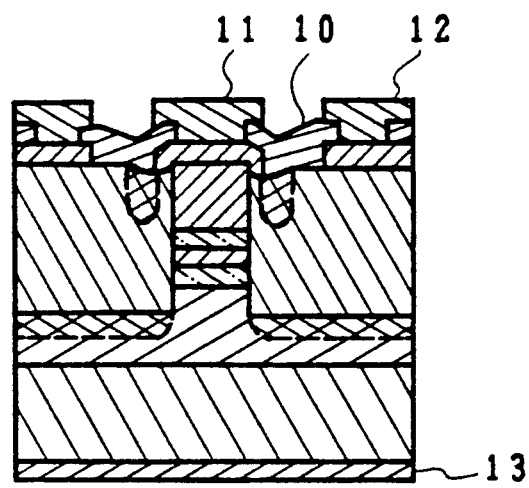
Figure 24C:
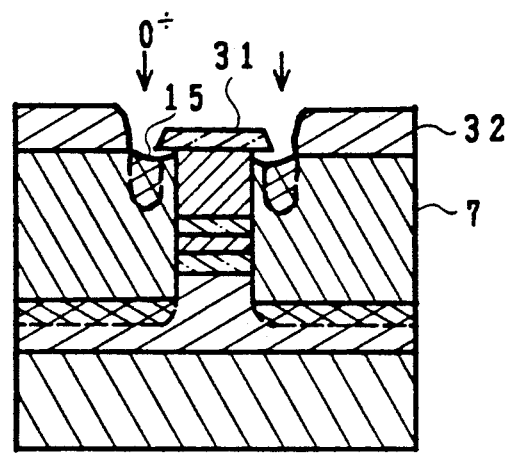

As shown in FIG. 24c, the same SiO₂ mask 31 is used to grow a buried layer 7 by the selective epitaxial growth method. Then, a resist mask 32 of a width larger than the mesa stripe is formed, and using the resist mask 32 and the SiO₂ mask 31, the second high resistant layer 15 is formed by ion injection.

Subsequently, as shown in FIG. 24d, the SiO₂ mask 31 and the resist mask 32 are removed, and a contact layer 8 is grown on the upper part of the mesa by the selective epitaxial growth in order to reduce contact resistance. Upon the buried layer 7 is formed a contact layer 9 similarly to the above.

Then, as shown in FIG. 24e, an insulating layer 10 is formed by SiO₂ deposition and the window opening for electrodes by photo-etching. An electrode 11 on the p-side such as Au/Cr and another electrode 12 on the n-side such as AuGeNi are formed by the lift-off method or the like.

As high resistant layers 14, 15 are self-aligned to the mesa as above, this invention can minimize unnecessary pn junctions.

Seventh Embodiment

Figure 25:
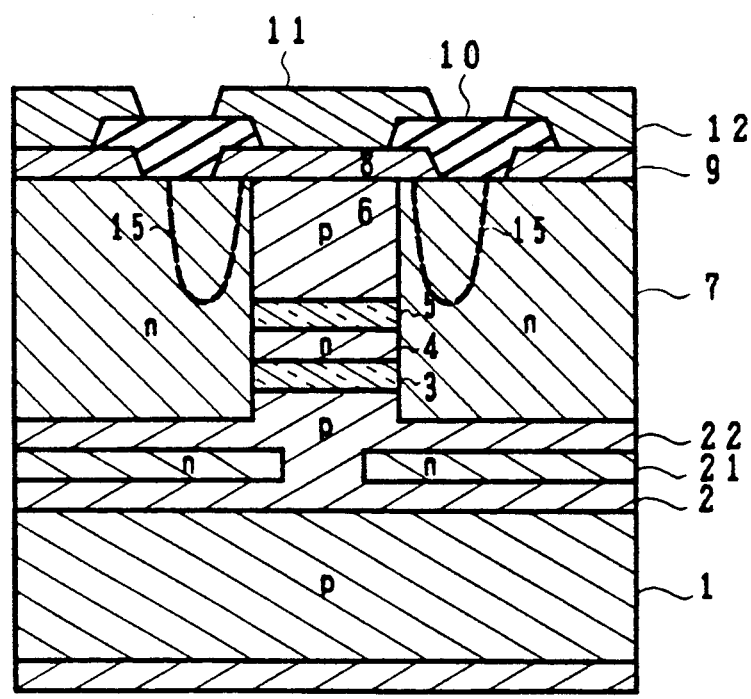
FIG. 25 is a sectional view showing the seventh embodiment of this invention semiconductor laser.

FIG. 25 shows the seventh embodiment semiconductor laser in the direction perpendicular to the waveguide direction thereof.

This embodiment differs from the sixth embodiment in that an n-type layer 21 and a p-type layer 22 are provided between the buffer layer 2 and the burying layer 7. The n-type layer 21 is interrupted at the mesa stripe, and the p-type layer 22 directly contacts the buffer layer 2. Otherwise the structure is similar to those in the sixth embodiment.

The method to form the n-type layer 21 may be by diffusion, etching or a selective epitaxial method.

FIG. 26 shows the diffusion method.

Figure 26A:
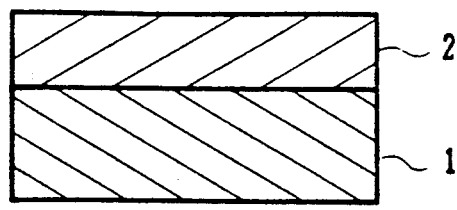
FIGS. 26a to 26d show the manufacturing procedure of the seventh embodiment by diffusion.
Figure 26B:
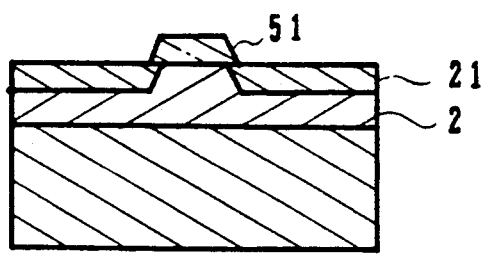

A substrate 1 is epitaxially grown with a buffer layer 2 as shown in FIG. 26a. Then, as shown in FIG. 26b, an SiO₂ film is deposited and then removed by photo-etching except for the portion of mesa to obtain an SiO₂ mask 51. Using the SiO₂ mask 51, an n-type additive such as H₂Se or H₂S is diffused in the buffer layer 2. This makes the surface of the buffer layer 2 an n-type layer 21.

Figure 26C:
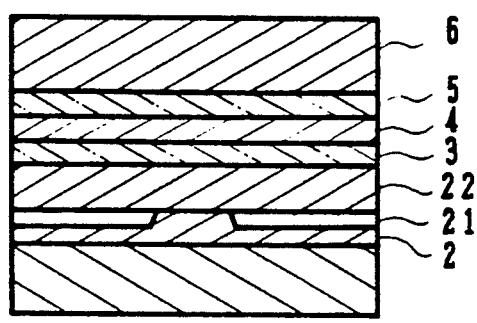

Then, as shown in FIG. 26c, a modulation layer 3, a base layer 4, an active layer 5 and a cladding layer 6 are sequentially grown by epitaxial growth to form a pnp structure.

Figure 26D:
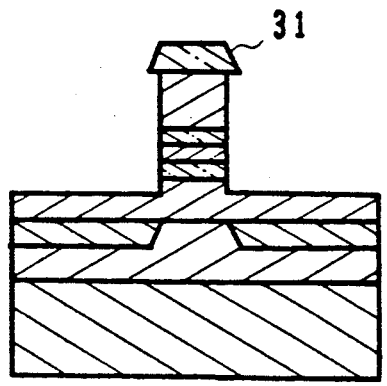

Then, as shown in FIG. 26d, using the SiO₂ mask 31, the structure is etched in mesa and processed similarly to the process described in relation to FIGS. 24b through 24e to obtain a semiconductor laser of the structure shown in FIG. 25.

Figure 27A:
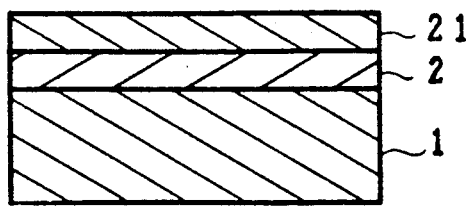
FIGS. 27a to 27c show the manufacturing procedure of the seventh embodiment by etching.
Figure 28A:
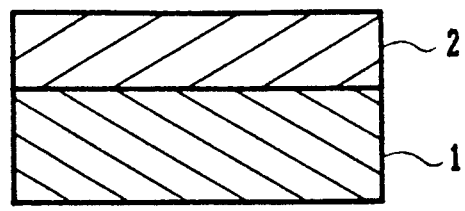
FIGS. 28a to 28d show the manufacturing procedure of the seventh embodiment by selective epitaxial growth.
Figure 27B:
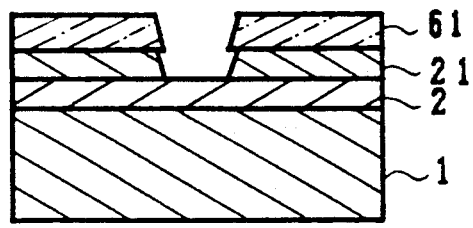
Figure 28B:
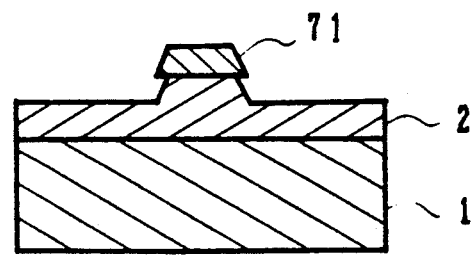
Figure 28C:
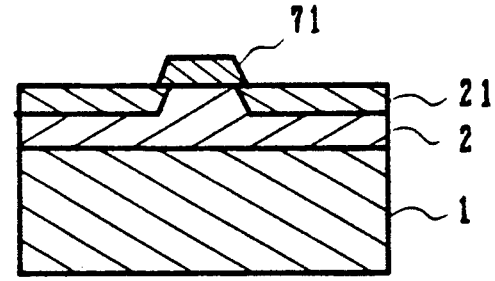
Figure 27C:
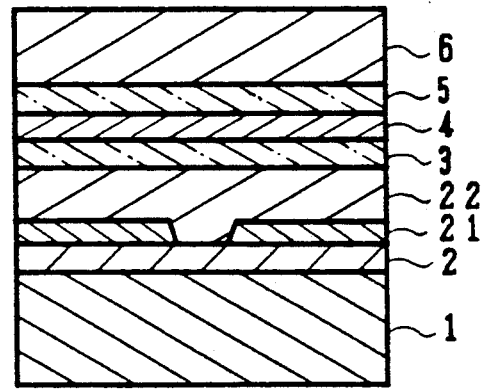
Figure 28D:
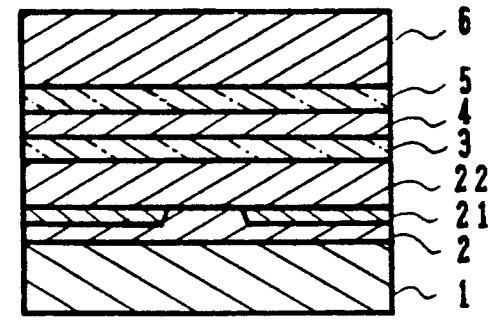

FIG. 27 shows an etching method. As shown, a buffer layer 2 is epitaxially grown on a substrate 1, and an n-type InP is epitaxially grown to obtain an n-type layer 21. The n-type layer 21 is etched using an SiO₂ mask 61 as shown in FIG. 27b. Then, as shown in FIG. 27c, a modulation layer 3, a base layer 4, an active layer 5 and a cladding layer 6 are sequentially grown by epitaxial growth to form a pnp structure.

Subsequently, similar processing steps to those described in relation to FIGS. 24b through 24e are executed to form a semiconductor laser of the structure shown in FIG. 25.

FIG. 28 shows a method of selective epitaxial growth method. As shown in FIG. 28a, a buffer layer 2 is epitaxially grown on a substrate 1. Then, the buffer layer 2 is given a mesa etching using an SiO₂ mask layer 71 as shown in FIG. 28b. This is followed by selective epitaxial growth of an n-type InP using the same SiO₂ mask 71 to form an n-type layer 21.

Subsequently, the SiO₂ mask 71 is removed; there are epitaxially grown a modulator layer 3, a base layer 4, an active layer 5 and a cladding layer 6 as shown in FIG. 27d. By executing the same process similar to the method described in reference to FIGS. 24b through 24e, a semiconductor laser of a structure shown in FIG. 25 is obtained.

Description has been given to the case of a pnp structure in the foregoing embodiments, but this invention may be applied to the case of an npn structure similarly. The positional relation between the active layer and the modulation layer may be reversed. This invention may be executed similarly even if a diffractive grating is provided in proximity to the active layer.

Parasitic electric current which would otherwise flow from the semiconductor layer outside of either the pnp structure or the npn structure to the buried layer may be reduced simply by using the pn junction of reverse bias or of high resistance layers thereby to effectively inject the electric current into the active layer and the modulation layer. This can lower the threshold level as well as improve modulation performance.

Even if the mesa stripe is narrow, and a wide contact layer should be formed to limit the contact resistance on the upper mesa at a low level, this would not form an unnecessary pn junction to secure effective current injection.

In the above mentioned embodiments, as the composition of the modulation layer, a composition of band gap energy larger than that of the active layer is used. This may make energy barrier between the semiconductors on both sides of the modulation layer smaller than the active layer, and therefore the carrier injected in the modulation layer may occasionally overcome the barrier thermally. This may lower the carrier injection efficiency in practice. An embodiment which solves this problem is now described.

Eighth Embodiment

Figure 29:
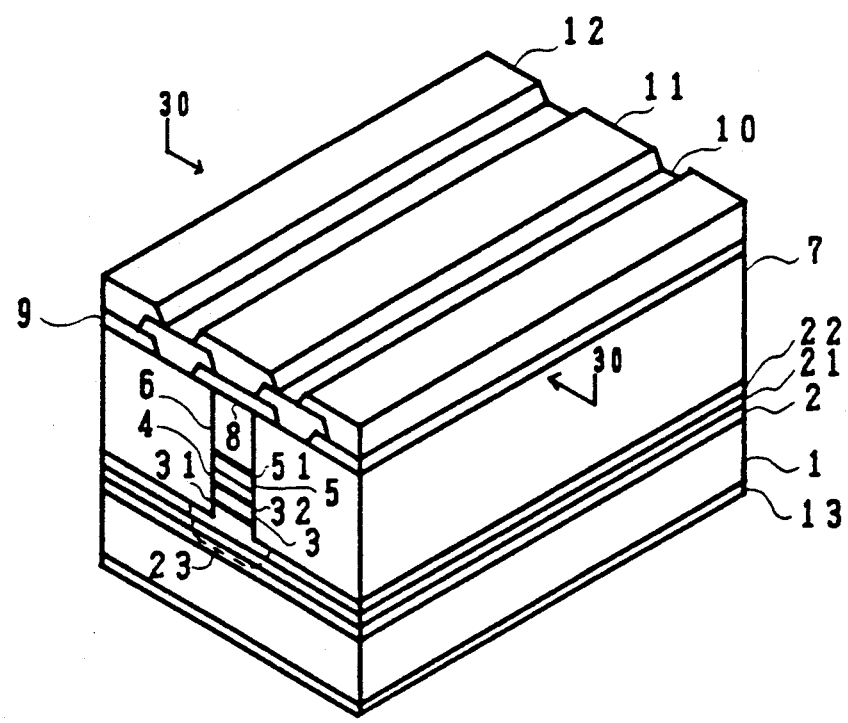
FIG. 29 is a perspective view showing the eighth embodiment of this invention's semiconductor laser.
Figure 30:
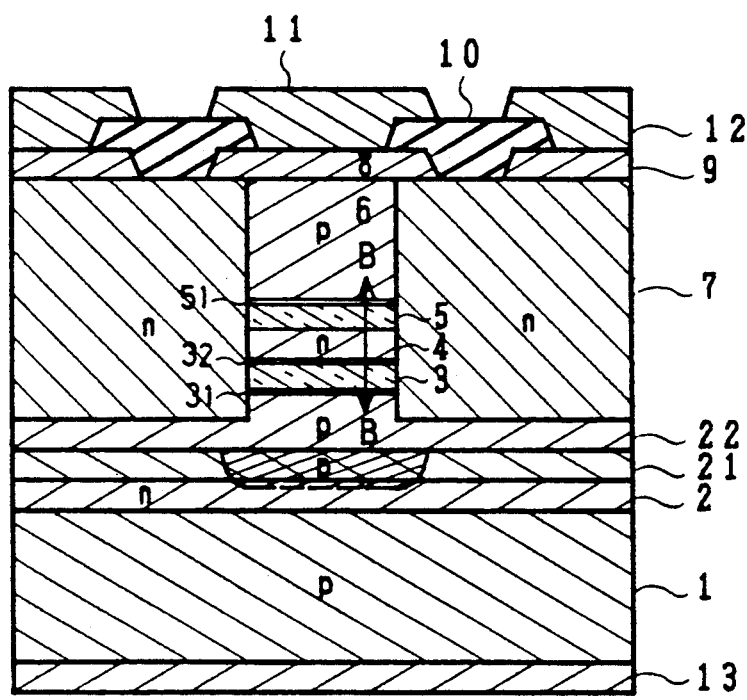
FIG. 30 is a sectional view showing the embodiment of FIG. 29 along the line 30—30.

FIG. 29 is a perspective view to show the eighth embodiment of this invention's semiconductor laser, and FIG. 30 a sectional view to show the same embodiment in the direction of line 30—30 of FIG. 29 (or the direction perpendicular to the waveguide direction). This embodiment is an application of the present invention in a semiconductor laser having a pnp structure.

The semiconductor laser has a p-type InP layer comprising a p⁺-type InP substrate 1, a buffer layer 2, a diffusion layer 23 and a p-type layer 22, and an n-type InP base layer 4 as the first and second semiconductor layers of different conductivity, and an InGaAsP modulation layer 3 as the third semiconductor layer formed between the above two semiconductor layers with a band gap energy narrower than the two semiconductor layers.

Between the buffer layer 2 and the p-type layer 22 is provided an n-type layer 21, and diffusion layer 23 is formed by diffusing p-type impurities in the n-type layer 21.

On the side opposite to the modulation layer 3 of the base layer 4 are provided an InGaAsP active layer 5, an InGaAsP guide layer 51 and a p-type cladding layer 6, and a mesa structure is formed with a part of the p-type layer 22, the modulation layer 3, the base layer 4, the active layer 5, the guide layer 51 and the cladding layer 6. The mesa structure is buried in the layer 7. A diffractive grating is formed on the guide layer 51.

The cladding layer 6 is connected to an electrode 11 via a p-type InGaAs contact layer 8, and the burying layer 7 is connected to an electrode 12 via the n-type InGaAs contact layer 9. The contact layers 8 and 9 and the electrodes 11 and 12 are electrically insulated from each other by an SiO$_2$ insulating layer 10. An electrode 13 is provided on the other side of the substrate 1.

This embodiment of a semiconductor laser according to this invention is characterized in that InGaAsP carrier confinement layers 31, 32 are provided respectively between the p-type layer 22 and the modulation layer 3 and between the base layer 4 and the modulation layer 3 as the fourth semiconductor layers which have a band gap energy smaller than that of the layer 3 and which are thinned to the extent not to lower substantially the carrier confinement effect of the modulator layer 3 and the carrier confinement layer 31,32 overall.

The carrier confinement layers 31, 32 should have a wavelength slightly smaller than the band gap wavelength (i.e. the optical wavelength equivalent to the band gap energy) of the active layer 5 so as to minimize absorption of the light emitted from the active layer 5. The thickness of the carrier confinement layers 31, 32 is set at a level which would not further deteriorate the carrier confinement effect by quantum effect, for instance, in the range of 20-50 nm.

Figure 31:
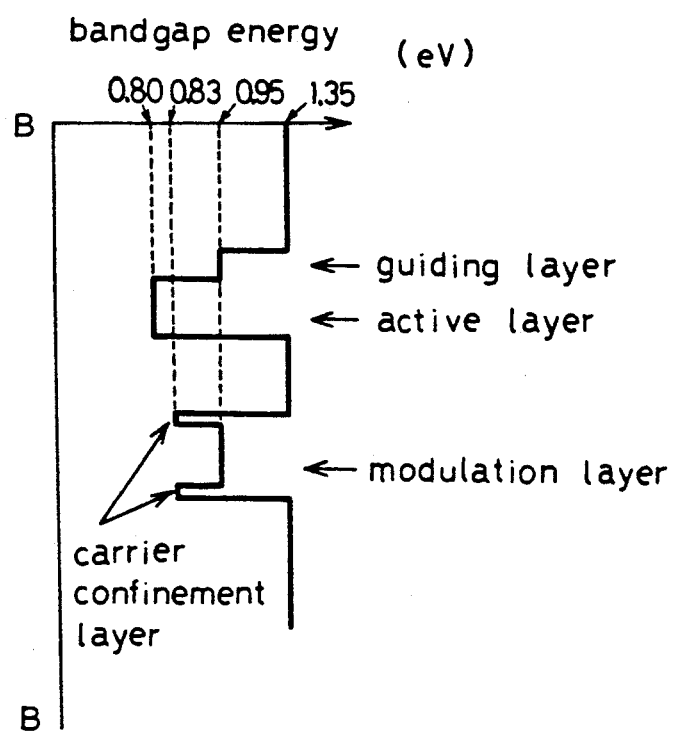
FIG. 31 show the band structure in proximity to the modulator layer.

FIG. 31 shows the band structure of the regions from the p-type layer 22 to the cladding layer 6.

In the operation of the semiconductor laser, carriers are injected into the active layer 5 with the electric current passing from the electrode 11 to the electrode 12 via the contact layer 8, the cladding layer 6, the active layer 5, the buried layer 7 and the contact layer 9. By using the injected current, the optical power of the laser may be controlled.

The refractive index on the modulation layer 3 and the carrier confinement layers 31,32 changes and the filter characteristics of the diffractive grating provided on the guiding layer 51 changes due to the electric current passing from the electrode 13 to the electrode 12 via the substrate 1, the buffer layer 2, the modulator layer 3, the base layer 4, the buried layer 7 and the contact layer 9. This can control the lasing wavelength.

In this embodiment, as the carrier confinement layers 31, 32 confine whole carriers in the modulation layer 3 and the carrier confinement layers 31, 32 to increase the carrier density thereof, the modulation efficiency may be improved with the injected current.

Figure 32A:
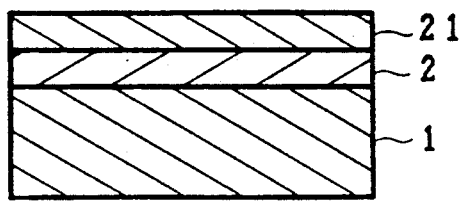
FIGS. 32a to 32e show the manufacturing method of the eighth embodiment.

FIGS. 32a through 32e illustrate the manufacturing procedure of this embodiment semiconductor laser. As shown in FIG. 32a, a p-type InP and an n-type InP are grown in this order on a p-type InP substrate 1 to form a buffer layer 2 and an n-type layer 21.

Figure 32B:
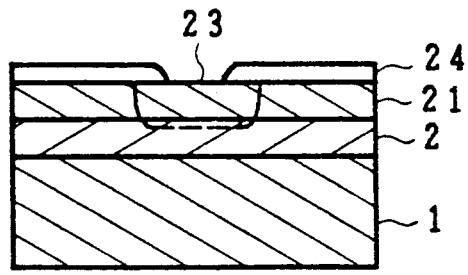

Then, as shown in FIG. 32b, an SiO$_2$ film is deposited on the surface of the n-type layer 21 by plasma CVD or the like method, and an SiO$_2$ mask with striped window is formed by photo-etching. By using thus formed SiO$_2$ mask, p-type impurities such as Zn are diffused to form the diffusion layer 23.

Figure 32C:
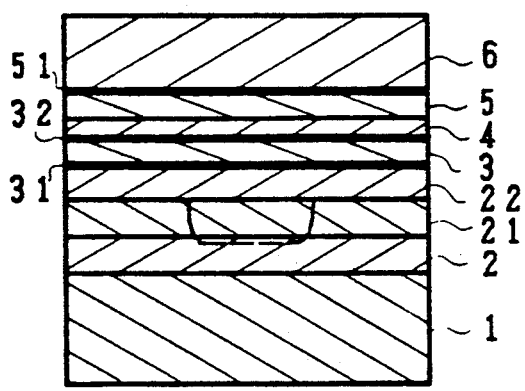

After removing the SiO$_2$ mask 24, a p-type layer 22, a carrier confinement layer 31, a modulation layer 3, a carrier confinement layer 32, a base layer 4, an active layer 5 and a guide layer 51 are grown in this order, and a cladding layer 6 is grown after having formed a diffractive grating on the guide layer 51 as shown in FIG. 32c.

Figure 32D:
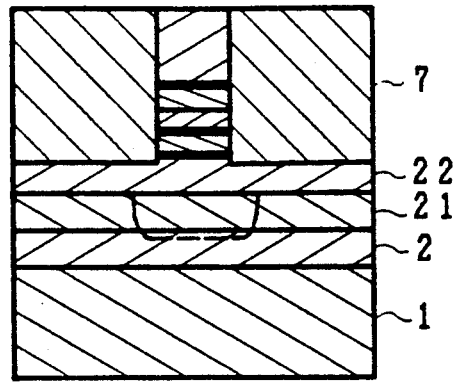
Figure 32E:
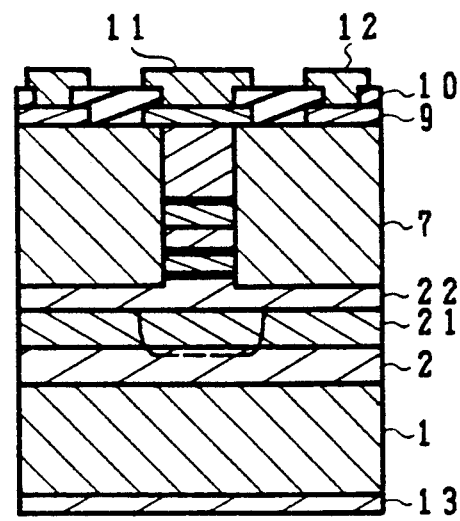

The active layer 5 may be a quantum well of InGaAs/InGaAsP instead of InGaAsP. The modulation layer 3 is designed to have a band gap wavelength shorter than that of the active layer 5 in order to prevent light absorption. The carrier confinement layers 31, 32 should have a band gap wavelength (i.e. the optical wavelength equivalent of the band gap energy) similar to the active layer 5 or longer than that of the modulation layer 3 in order to enhance the carrier confinement effect. The thickness of the carrier confinement layer 31 and 32 is limited to 20-50 nm to minimize the light absorption. A diffractive grating is provided on the guide layer 51 for wavelength selection by optical holographic lithography or the like. After the cladding layer 6 is grown, photo-etching is conducted with the SiO$_2$ mask to expose the position deeper than the carrier confinement layer 31 in mesa. Using the same mask for selective epitaxial growth, an n-type InP buried layer 7 is formed as shown in FIG. 32d.

By similarly selective epitaxial growth method, a p-type InGaAs contact layer 8 and an n-type InGaAs contact layer 9 are grown respectively above the cladding layer 6 and the buried layer 7 in order to reduce contact resistance. SiO$_2$ is then deposited and windows are opened on the electrodes by photo-etching to form an insulating layer 10. A p-type electrode 11 such as Au/Cr and an n-type electrode 12 such as AuGeNi are formed by the lift-off method or the like. An Au/Cr electrode 13 is formed on the other side of the substrate 1. The semi-conductor is subjected to annealing for alloying. This provides the structure shown in FIG. 32e. Laser chips are obtained by cleaving the structure.

Ninth Embodiment

Figure 33:
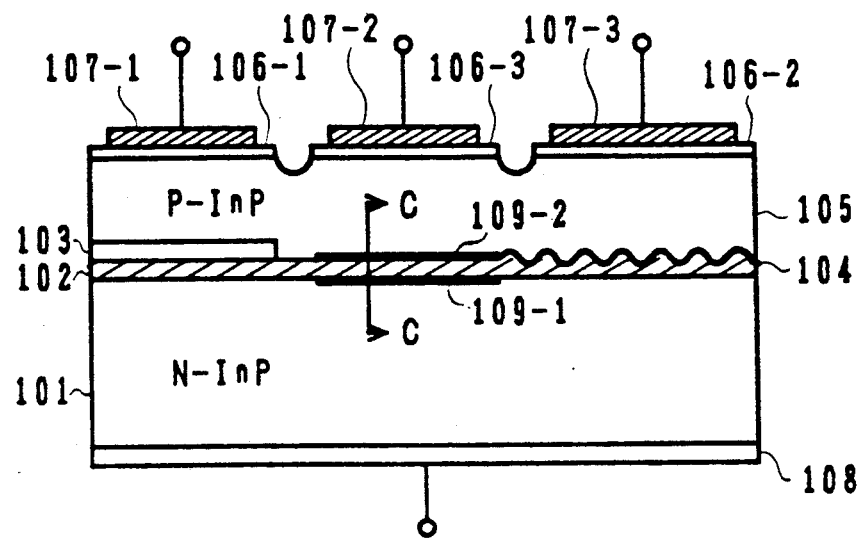
FIG. 33 is a sectional view of the ninth embodiment of this invention wavelength tunable multiple electrode DBR laser diode.

FIG. 33 shows in section the ninth embodiment of this invention's wavelength tunable DBR laser. In the figure, the structure is extremely simplified. This embodiment is an application of the present invention to an optical waveguide.

An InGaAsP waveguide layer 102 is formed on the n-type InP substrate 101, an InGaAsP active layer 103 is provided in proximity to an end of the layer 102, and a diffractive grating 104 is formed on the surface of the layer 102 at the other end thereof. The waveguide layer 102, the active layer 103 and the diffractive grating 104 are overlaid with a p-type InP layer 105 on the side opposite to the substrate 101. The active layer 103, the diffractive grating 104, and other regions are overlaid with p$^+$-type InGaAsP contact layers 106-1 through 106-3 correspondingly, and electrodes 107-1 through 107-3 are provided respectively. An electrode 108 is provided on the other surface of the substrate 101.

The region provided with the active layer 103, the contact layer 106-1 and the electrode 107-1 will be referred to below as an active section, the region provided with the diffractive grating 104, the contact layer 106-2, and the electrode 107-2 as a DBR section, and the region provided with the contact layer 106-3 and the electrode 107-3 as a phase control section.

The waveguide layer 102 has a band gap energy smaller than that of the substrate 1 and the p-type InP layer 105. The DBR section and the phase control section include carrier confinement layers 109-1 and 109-2 which have a band gap energy further narrower than that of the wave-guide 102 and which respectively face the substrate 101 and the p-type InP layer 105.

Figure 34:
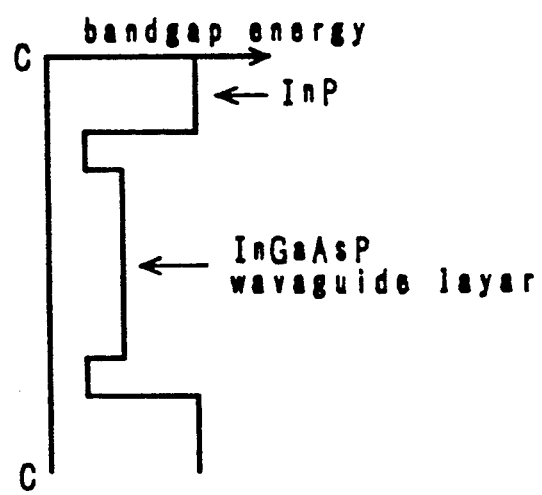
FIG. 34 shows a band structure in proximity to the waveguide layer thereof.

FIG. 34 shows the band structure close to the waveguide layer 102 of the phase control section.

When electric current is supplied between the electrodes 107-1 and 108, the active layer 103 emits light due to the injection of carriers. The emitted light propagates through the layer 102, is reflected from the diffractive grating 104 and is fed back to the active layer 103. Due to the current between the electrodes 107-2 and 108, there is a change in the refractive index of the waveguide on the portion where the diffractive grating 104 is located, and consequently a change in the reflected wavelength. Due to the current between the electrodes 107-3 and 108, the refractive index changes on the waveguide layer in the phase control section which thereby enable alignment in phase between the active layer 103 and the diffractive grating 104.

As carrier confinement layers 109-1 and 109-2 are provided on the waveguide layer 105 in the phase control and DBR sections in this embodiment, carrier injection efficiency therein is improved.

As the number of carriers which flow from the layers in which carriers are injected is reduced in the eighth and ninth embodiments, they are effective in improving current efficiency.

As the electric current efficiency may be enhanced, there is no need to pass a large electric current, and even if a large electric current is needed, it can reduce the carriers which would otherwise flow out of the injected layers due to the heat generation and band-filling effect, as well as to prevent saturation of carrier density in these layers to thereby inhibit a phenomenon where changes in optical characteristics such as the refractive index or optical absorption no longer occur.

Accordingly, they are quite effective when applied to a monolithic integrated laser with a phase modulator or a wavelength tunable laser, as it can extend phase modulation width or tunable wavelength width.

In the embodiments mentioned above, two layers with a narrow band gap energy are used for an active layer and a modulation layer respectively. In the embodiments below, both layers are used as active layers.

Tenth Embodiment

Figure 35:
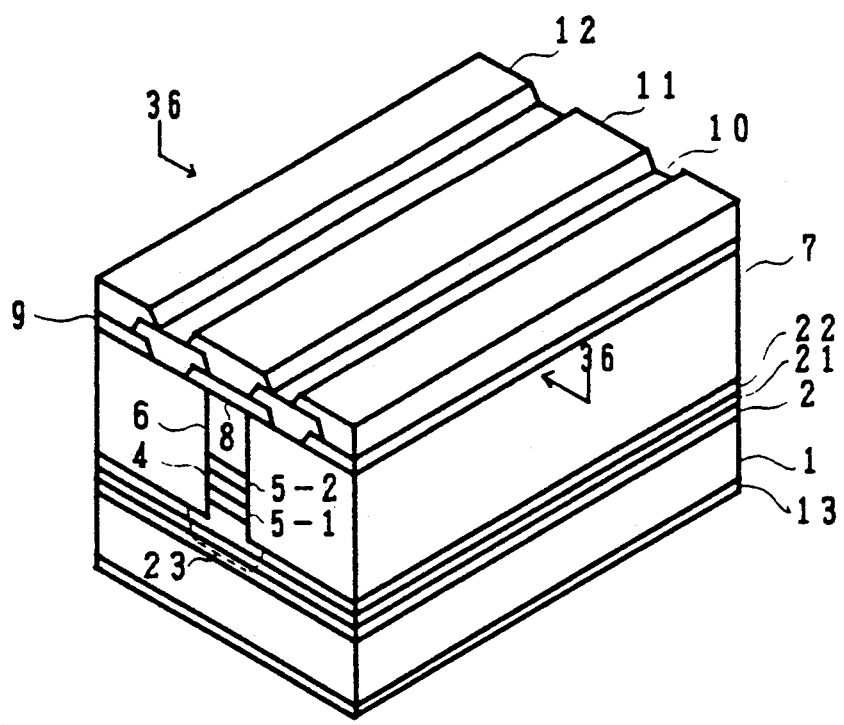
FIG. 35 is a perspective view showing the tenth embodiment of this invention semiconductor laser.
Figure 36:
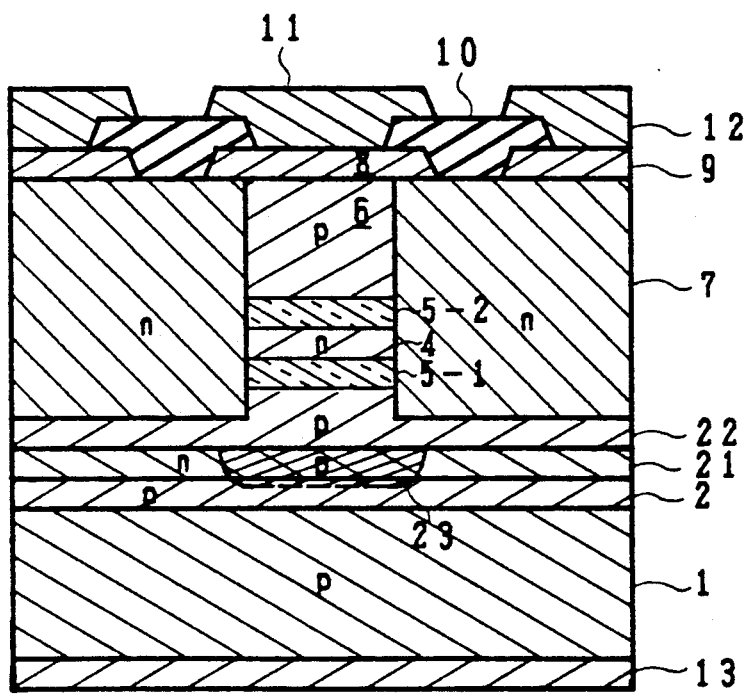
FIG. 36 is a sectional view of the embodiment of FIG. 35 along the line 36—36.

FIG. 35 shows the tenth embodiment of this invention's semiconductor laser in perspective view while FIG. 36 shows the same embodiment in section along the line 36—36 of FIG. 35 (i.e., in a direction perpendicular to the waveguide direction). This embodiment is an application of this invention in a pnp semiconductor laser.

The semiconductor laser includes as the first pn structure including two semiconductor layers of different conductivity, a p-type InP layer comprising a p+ InP substrate 1, a buffer layer 2, a diffusion layer 23 and a p-type layer 22 and an n-type InP separating layer 4, and a first active layer 5-1 of a band gap energy narrower than those of the two semiconductor layers is formed between the two semiconductor layers.

This embodiment is characterized in that a p-type InP cladding layer 6 is provided on the n-type separating layer 4 as the second pn structure which is to form a pnp structure or npn structure with the first pn structure on the side of the separating layer 4. The pn junction of the second pn structure is provided with a second active layer 5-2 which has a band gap energy narrower than that of the two semiconductors on both sides thereof and which has a band gap energy different from the above.

A part of the p-type layer 22, the active layer 5-1, the base layer 4, the active layer 5-2 and the cladding layer 6 form a mesa structure. The structure is buried in the layer 7.

The cladding layer 6 is connected to the electrode 11 via the p-type InGaAs contact layer 8, and the burying layer 7 to the electrode 12 via the n-type InGaAs contact layer 9. The contact layers 8 and 9 and the electrodes 11 and 12 are electrically insulated from each other with $SiO_2$ insulating layers 10, and another electrode 13 is provided on the reverse surface of the substrate 1.

For lasing on the active layer 5-1, the electric current is supplied from the electrode 13 to the electrode 12 via the substrate 1, the buffer layer 2, the active layer 5-1, the base layer 4, the burying layer 7 and the contact layer 9 to inject carriers into the layer 5-1. For lasing on the active layer 5-2, the electric current is supplied from the electrode 1 to the electrode 12 via the contact layer 8, the cladding layer 6, the active layer 5-2, the burying layer 7 and the contact layer 9 to inject carriers therein.

Figure 37A:
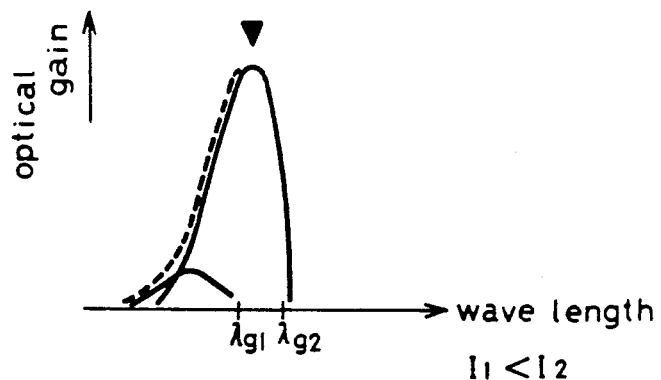
FIGS. 37a to 37c are graphs showing variations of optical gain spectra.
Figure 37B:
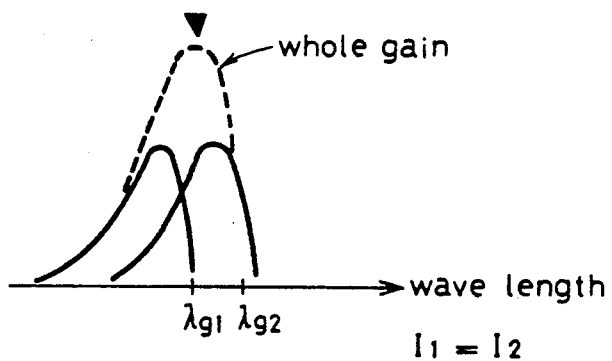
Figure 37C:
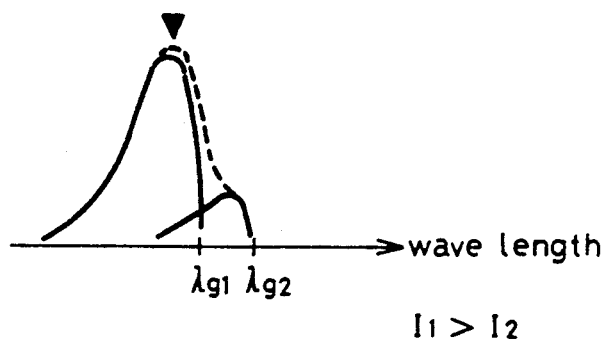

FIGS. 37a through 37c show changes in the optical gain spectrum.

As the band gap differs between the active layers 5-1 and 5-2, the optical gain of the device as a whole is determined depending on the electric current supplied to each component and their dimensional relation.

It is assumed that the electric current passed to either one of active layers 5-1 and 5-2 which has a larger band gap energy is denoted as $I_1$, the wavelength equivalent to the band gap energy as $\lambda_{g1}$, the electric current passing to the other active layers 5-2, 5-1 as $I_2$, and the wavelength as $\lambda_{g2}$. When the relation of $I_l<I_2$ holds as shown in FIG. 37a, the optical gain is obtained at a location closer to the wavelength $\lambda_{g2}$ rather than the wavelength $\lambda_{g1}$. When the relation of $I_1=I_2$ holds as shown in FIG. 37b, the optical gain is obtained at a frequency substantially at the middle thereof, and if $I_1>I_2$, optical gain is obtained closer to the wavelength $\lambda_{g1}$ or on the side having the wavelength shorter than that.

More specifically, if the ratio of the injected currents in the active layers 5-1 and 5-2 are continuously changed, the peak wavelength of the optical gain may be varied. This means the wavelength at the lasing center of Fabry-Perot laser may be variably controlled. By selecting the band gap wavelengths of the two active layers 5-1 and 5-2 suitably, it is possible to extend the optical gain width of the device as a whole. It is therefore highly useful as the light source for a wavelength tunable laser.

Strictly speaking, the optical gain on the active layer on the side of shorter wavelength contributes less to the optical gain of the device as a whole due to the optical absorption on the longer wavelength side.

In order to reduce the optical absorption by the active layer on the longer wavelength side, two active layers 5-1 and 5-2 should be formed with quantum well structures and transition energy should be deviated practically on the active layers by changing the band gap wavelength or thickness. This enables setting optical absorption at a lower level by the active layer on the side of the smaller transition energy (or the longer wave-length).

FIGS. 38a through 38e show the manufacturing procedure of the tenth embodiment.

Figure 38A:
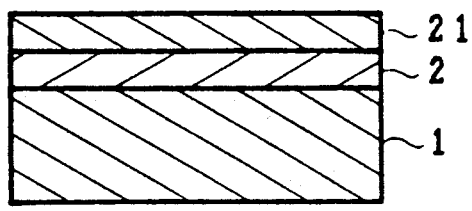
FIGS. 38a to 38e show the manufacturing procedure of the tenth embodiment of this invention.
Figure 38B:
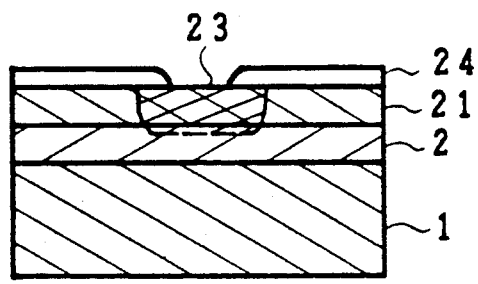

As shown in FIG. 38a, a p-type InP and an n-type InP are sequentially grown in this order on a p-type substrate 1 to form a buffer layer 2 and an n-type layer 21. Then, as shown in FIG. 38b, an SiO₂ film is deposited on the surface of the n-type layer 21 by the plasma CVD method or the like, and an SiO₂ mask is formed with striped windows by photo-etching method. By using thus formed SiO₂ mask 24, a p-type impurity such as Zn is diffused to form a diffusion layer 23.

Figure 38C:
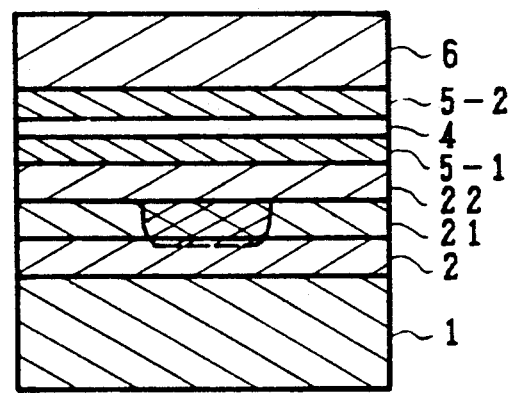

Then, after removing the mask 24, a p-type layer 22, an active layer 5-1, a base layer 4, an active layer 5-2, and a cladding layer 6 are grown sequentially in this order as shown in FIG. 38c. As the active layers 5-1 and 5-2, quantum wells of InGaAsP or InGaAs/InGaAsP may be used.

Figure 38D:
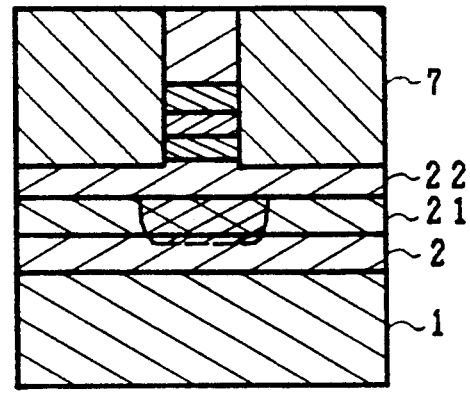

Having formed the cladding layer 6, the structure is subjected to photo-etching with the SiO₂ mask to expose a position deeper than the lower active layer 5-1 in mesa. The same SiO₂ mask is then used as a selective epitaxial growth mask, and a buried layer 7 of an n-type InP is formed as shown in FIG. 38d.

Figure 38E:
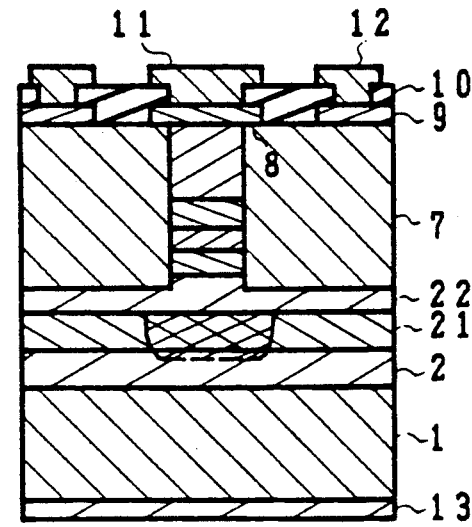

By a similar selective epitaxial growth method, a p-type InGaAs contact layer 8 and an n-type InGaAs contact layer 9 are grown respectively on the cladding layer 6 and the buried layer 7 in order to reduce the contact resistance. SiO₂ is then deposited, and the location for electrodes is photo-etched to open windows, and the insulating layers 10 are formed. Subsequently, an electrode 11 of a p-type such as Au/Cr and an electrode 12 of an n-type such as AuGeNi are formed by the lift-off method or the like. On the back of the substrate 1 is formed an Au/Cr electrode 13 which is subjected to annealing for alloying. The structure shown in FIG. 38e is thus obtained, which is cleaved to produce laser chips.

This embodiment may be used as an optical amplifier of a traveling wave type if an anti-reflecting coating is provided on both end faces of the waveguide. By the injected electric current in the active layers 5-1 and 5-2, the optical gain spectrum may be variably controlled.

Eleventh Embodiment

Figure 39:
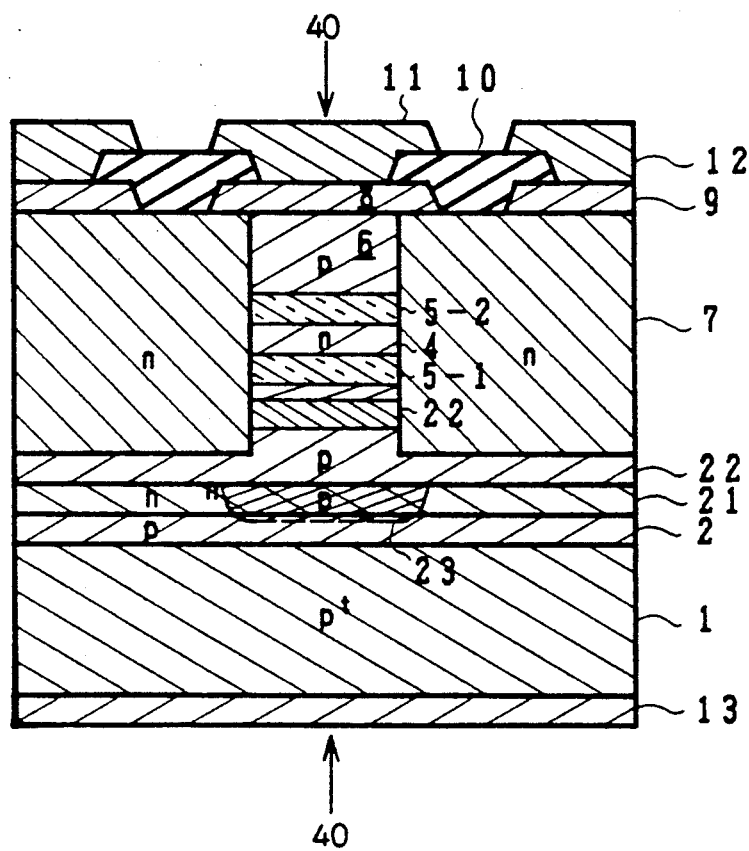
FIG. 39 is a sectional view taken along the line 39—39 of FIG. 40 and showing the eleventh embodiment of this invention's wavelength tunable multiple electrode DBR laser diode in the direction of waveguide.
Figure 40:
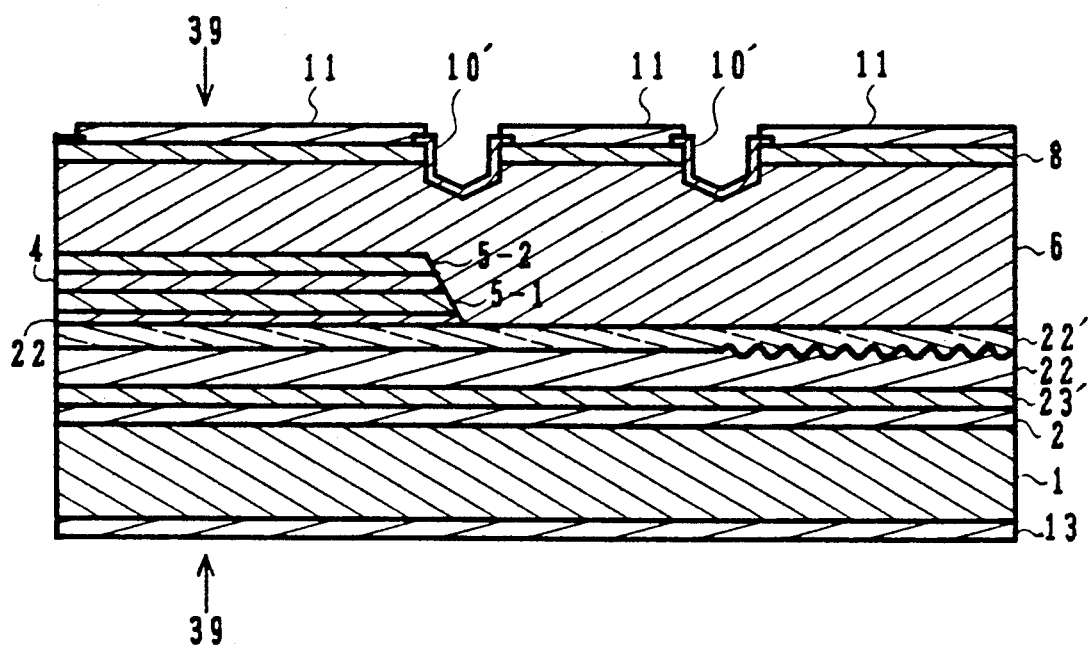
FIG. 40 is a sectional view taken along the line 40—40 of FIG. 39 and showing the eleventh embodiment of this invention in the direction perpendicular to the waveguide in the light emitting section.

FIGS. 39 and 40 show in section the eleventh embodiment of this invention which is applied to a wavelength tunable DBR laser; FIG. 40 is a sectional view along the direction of waveguide while FIG. 39 which is taken along the line 39—39 of FIG. 40, is a sectional view perpendicular thereto in the light emitting region.

As shown in FIG. 40, electrode 11 is divided into three sections corresponding to the light emitting, the phase control and DBR sections. They are isolated electrically by SiO₂ insulating layers 10' as shown in FIG. 40. The electrode 12 is provided only on the light emitting section as shown in FIG. 39.

The light emitting section is provided with a structure similar to the tenth embodiment. However, it differs from the tenth embodiment in that an InGaAsP guide layer 22' is provided within the p-type layer 22. The guide layer 22' extends along the entire length of the device. The active layers 5-1 and 5-2 and the base layer 4 are provided only on the light emitting section.

As described in the foregoing, the tenth and the eleventh embodiments control the peak wavelength of optical gain with the electric current injected into the two active layers as well as change the lasing wavelength. When used as an optical amplifier, it is effective in variably controlling the optical gain spectrum. Further, it is effective to obtain a lasing light source with a wide optical gain spectrum.

The invention is not limited to the embodiments described above but only by the appended claims the scope of which includes equivalents.

What is claimed is:

1. An optical waveguide semiconductor comprising:
   a substrate formed of one conduction type,
   a semiconductor waveguide layer on said substrate,
   an active layer on said waveguide layer adjacent one end thereof,
   a diffractive grating formed on a surface of said waveguide layer at the other end thereof,
   said active layer and diffractive grating being on a side of said waveguide layer opposite said substrate,
   an opposite conductivity layer having a conduction type opposite to said substrate and covering said active layer, waveguide layer and diffractive grating,
   said waveguide layer having a band gap energy smaller than that of said substrate and said opposite conductivity layer,
   said waveguide layer being divided into an active section which includes said active layer, a DBR section which includes said diffractive grating and a phase control section,
   two carrier confinement layers which have a band gap energy narrower than said band gap energy of said waveguide layer being respectively disposed on opposite sides of said waveguide layer in said DBR section and phase control section,
   first, second and third electrodes connected electrically with the substrate, waveguide layer, and opposite conductivity layers, respectively, and
   means for electrically energizing said electrodes to produce an optical output.

2. An optical device which is used as a laser, light emitting diode or optical amplifier comprising:
   a first pn structure including first and second semiconductor layers of different conductivity types;
   an active layer for light emission having a band gap energy narrower than that of said first and second semiconductor layers and which is formed between said first and second semiconductor layers and adjacent a first side of said second semiconductor layer;
   a second pn structure including said second semiconductor layer and a third semiconductor layer on a side of said second semiconductor layer opposite to said first side of said second semiconductor layer, to form one of a pnp structure or an npn structure with said first pn structure;
   an additional layer disposed at a pn junction of said second pn structure and having a band gap energy narrower than that of the second and third semiconductor layers;
   first, second and third electrodes connected electrically with the first, second and third semiconductor layers, respectively;
   first bias means connected with said first and second electrodes to apply a forward bias to the first pn structure for supplying a driving current to said active layer; and
   second bias means connected with said second and third electrodes to apply a reverse bias to said pn junction of said second pn structure to induce a change of an absorption coefficient on said additional layer for controlling an output light intensity.

3. An optical device as in claim 2 wherein said additional layer is a quantum well structure.

4. An optical device as in claim 2 wherein said additional layer is of bulk crystal.

5. An optical device as in claim 2 including a diffractive grating formed guide layer at the vicinity of one of said additional and active layers.

6. An optical device as in claim 2 wherein said active layer is formed in a stripe-shaped pattern and buried in a burying semiconductor layer of the same conductivity type as said second semiconductor layer.

7. An optical device as in claim 6 wherein not only the active layer but also the second and additional layers are formed in a stripe-shaped pattern and buried in said burying semiconductor layer.

8. An optical device as in claim 7 further comprising a high resistance layer between said burying semiconductor layer and at least one of said first and third semiconductor layers.

9. An optical device as claimed in claim 8 wherein said high resistance layer includes a reverse biased pn junction.

10. An optical device which is used as a laser, light emitting diode or optical amplifier comprising:
a first pn structure including first and second semiconductor layers of different conductivity type;
an active layer for light emission having a band gap energy narrower than that of said first and second semiconductor layers and which is formed between said first and second semiconductor layers and adjacent a first side of said second semiconductor layer;
a second pn structure including said second semiconductor layer and a third semiconductor layer on a second side of said second semiconductor layer, opposite to said first side of said second semiconductor layer, to form one of a pnp structure or an npn structure with said first pn structure;
an additional layer disposed at a pn junction of said second pn structure and having a band gap energy narrower than that of the second and third semiconductor layers;
first, second and third electrodes connected electrically with the first, second and third semiconductor layers, respectively;
first bias means connected with said first and second electrodes to apply a forward bias to the first pn structure for supplying a driving current to said active layer; and
a second bias means connected with said second and third electrodes to apply a forward bias to said pn junction of said second pn structure to inject an electric current to said additional layer for controlling a lightwave phase or a light wavelength of said optical device.

11. An optical device as in claim 10 wherein a refractive index in said additional layer is controlled by the current from said second bias means to modulate a wavelength or phase of a light generated in the active layer.

12. An optical device as in claim 10 wherein said additional layer is a quantum well structure.

13. An optical device as in claim 10 wherein said additional layer is of bulk crystal.

14. An optical device as in claim 10 including a diffractive grating formed guide layer at the vicinity of one of said additional and active layers.

15. An optical device as in claim 10 wherein said active layer is formed in a stripe-shaped pattern and buried in a burying semiconductor layer of the same conductivity type as said second semiconductor layer.

16. An optical device as in claim 15 wherein not only the active layer but also the second and additional layers are formed in a stripe-shaped pattern and buried in said burying semiconductor layer.

17. An optical device as in claim 16 wherein the optical device comprising a high resistance layer between said burying semiconductor layer and at least one of said first and third semiconductor layers.

18. An optical device as claimed in claim 17 wherein said high resistance layer includes a pn junction of reverse bias.

19. An optical device as in claim 11 wherein said additional layer is a quantum well structure.

20. An optical device as in claim 11 wherein said additional layer is of bulk crystal.

21. An optical device as in claim 11 including a diffractive grating formed guide layer at the vicinity of one of said additional and active layers.

22. An optical device as in claim 11 wherein said active layer is formed in a stripe-shaped pattern and buried in a burying semiconductor layer of the same conductivity type as said second semiconductor layer.

23. An optical device as in claim 22 wherein not only the active layer but also the second and additional layers are formed in a stripe-shaped pattern and buried in said burying semiconductor layer.

24. An optical device as in claim 23 wherein the optical device comprising a high resistance layer between said burying semiconductor layer and at least one of said first and third semiconductor layers.

25. An optical device which is used as a laser, light emitting diode or optical amplifier comprising:
a first pn structure including first and second semiconductor layers of different conduction types;
a first active layer for light emission having a band gap energy narrower than that of said first and second semiconductor layers and which is formed between said first and second semiconductor layers and adjacent a first side of said second semiconductor layer;
a second pn structure including said second semiconductor layer and a third semiconductor layer on a side of said second semiconductor layer opposite to said first side of said second semiconductor layer to form one of a pnp structure and an npn structure with said first pn structure;
an additional layer disposed at a pn junction of said second pn structure and having a band gap energy narrower than that of the second and third semiconductor layers;
first, second and third electrodes connected electrically with the first, second and third semiconductor layers, respectively;
a first bias means connected with said first and second electrodes to apply a forward bias to the first pn structure; and
a second bias means connected with said second and third electrodes to apply a forward bias to the second pn structure so that a peak wavelength of an optical gain varies by a ratio of injected currents in said first and second active layers via said first and second bias means,
wherein said additional layer is a second active layer having a band gap energy different from that of said first active layer.

* * * * *